(12) United States Patent
Borland et al.

(10) Patent No.: US 7,741,189 B2
(45) Date of Patent: Jun. 22, 2010

(54) ELECTRODES, INNER LAYERS, CAPACITORS, ELECTRONIC DEVICES AND METHODS OF MAKING THEREOF

(75) Inventors: William J. Borland, Cary, NC (US);
Saul Ferguson, Durham, NC (US);
Diptarka Majumdar, Cary, NC (US);
Richard Ray Traylor, Angier, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 775 days.

(21) Appl. No.: 11/453,496

(22) Filed: Jun. 15, 2006

(65) Prior Publication Data

US 2006/0284280 A1 Dec. 21, 2006

Related U.S. Application Data

(60) Provisional application No. 60/692,119, filed on Jun. 20, 2005.

(51) Int. Cl.
*H01L 21/20* (2006.01)

(52) U.S. Cl. ........................................ 438/396; 257/532

(58) Field of Classification Search ................. 438/396; 257/532

See application file for complete search history.

(56) References Cited

U.S. PATENT DOCUMENTS

| 6,370,013 | B1 * | 4/2002 | Iino et al. ................. 361/306.3 |
| 6,631,551 | B1 * | 10/2003 | Bowles et al. .................. 29/620 |
| 2004/0023361 | A1 | 2/2004 | Gaier et al. |
| 2004/0099999 | A1 | 5/2004 | Borland |

OTHER PUBLICATIONS

Search Report for corresponding European patent application No. 06253168.6, dated Oct. 16, 2006.
U.S. Appl. No. 10/801,326, filed Mar. 16, 2004, Borland et al.
U.S. Appl. No. 10/801,257, filed Mar. 16, 2004, Borland et al.

* cited by examiner

*Primary Examiner*—Zandra Smith
*Assistant Examiner*—Jamie Niesz

(57) ABSTRACT

A method of embedding thick-film fired-on-foil capacitors includes entirely covering the dielectric with an encapsulating electrode to avoid cracking in the dielectric due to shrinkage and temperature coefficient of expansion differences between the electrode and dielectric.

15 Claims, 24 Drawing Sheets

ELECTRODES, INNER LAYERS, CAPACITORS, ELECTRONIC DEVICES AND METHODS OF MAKING THEREOF

This application claims the benefit of U.S. Provisional Application No. 60/692,119 filed Jun. 20, 2005.

BACKGROUND

1. Technical Field

The technical field is embedded capacitors in printed wiring boards (PWB). More particularly, the technical field includes embedded capacitors in printed wiring boards made from thick film dielectrics and electrodes.

2. Technical Background of the Invention

The practice of embedding high capacitance density capacitors in printed wiring boards allows for reduced circuit size and improved circuit performance. Capacitors are typically embedded in panels that are stacked and connected by interconnection circuitry; the stack of panels forming a multilayer printed wiring board. The stacked panels can be generally referred to as "innerlayer panels."

Passive circuit components embedded in printed wiring boards formed by fired-on-foil technology are known. "Separately fired-on-foil" capacitors are formed by depositing and drying at least one thick-film dielectric layer onto a metallic foil substrate, followed by depositing and drying a thick-film electrode material over the thick-film capacitor dielectric layer and subsequently firing the capacitor structure under copper thick-film firing conditions. U.S. Patent Application Publication Nos. U.S. 2004/0099999 A1 and U.S. 2004/023361 A1 (cofired divisional) to Borland disclose such a process.

After firing, the resulting article may be laminated to a prepreg dielectric layer, and the metallic foil may be etched to form the electrodes of the capacitor and any associated circuitry to form an inner layer panel containing thick-film capacitors. The inner layer panel may then be laminated and interconnected to other inner layer panels to form a multilayer printed wiring board.

The thick-film dielectric material should have a high dielectric constant (K) after firing. A high K thick-film dielectric paste suitable for screen printing may be formed by mixing a high dielectric constant powder (the "functional phase") with a glass powder and dispersing the mixture into a thick-film screen-printing vehicle. The glass may be vitreous or crystalline, depending on its composition.

During firing of the thick-film dielectric material, the glass component of the dielectric material softens and flows before the peak firing temperature is reached. It coalesces and encapsulates the functional phase during the hold at peak temperature forming the fired-on-foil capacitor structure. The glass may subsequently crystallize to precipitate any desired phases.

Copper is a preferred material for forming electrodes. A thick-film copper electrode paste suitable for screen printing may be formed by mixing copper powder with a small amount of glass powder and dispersing the mixture into a thick-film screen printing vehicle. However, the large temperature coefficient of expansion (TCE) difference between the thick-film copper and the thick-film capacitor dielectric, and shrinkage differences during firing often lead to tensile stress in the dielectric just outside the periphery of the electrode. The tensile stresses may result in cracking in the dielectric around the periphery of the electrode as shown in FIG. 1A and FIG. 1B. In extreme circumstances, the cracks can extend all the way down to the copper foil. Such cracking is undesirable, as it may affect long-term reliability of the capacitor. Alternative capacitor structure designs that eliminate the conditions that lead to such cracking would be advantageous.

The present inventors have provided novel method(s) of forming electrodes and inner layers, embedding thick-film fired-on-foil capacitors, and forming printing wiring boards which avoid this cracking in the dielectric. Additionally, the present inventors have developed the electrodes, inner layers, capacitors and printed wiring boards formed by these methods.

SUMMARY

A first embodiment of the present invention is directed to a method of forming an embedded capacitor, comprising: providing a metallic foil; forming a dielectric layer over the metallic foil; forming a first electrode over the entirety of said dielectric layer and at least a portion of said metallic foil; and firing said embedded capacitor; etching the metallic foil to form a second electrode.

A second embodiment of the present invention is directed to a method of making a device, comprising: providing a metallic foil; forming a dielectric over the metallic foil, thus, forming a component side and a foil side of said metallic foil; forming a first electrode over the entirety of the dielectric and over a portion of the metallic foil; laminating the component side of the metallic foil to at least one prepreg material; etching the metallic foil to form a second electrode, wherein the first encapsulating electrode, the dielectric and the second electrode form a capacitor.

The present invention is further directed to various devices and capacitors formed utilizing the methods noted above and below in the detailed description of the invention. Additionally, the present invention is directed to devices comprising the capacitors detailed above and below in the detailed description of the invention.

BRIEF DESCRIPTION OF THE DRAWINGS

The detailed description will refer to the following drawings wherein.

Figure 1A:
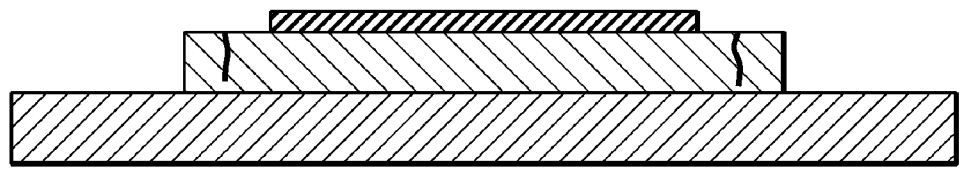
FIGS. 1A-1B are views illustrating cracks observed in conventional prior art designs of fired-on-foil capacitors.
Figure 1B:
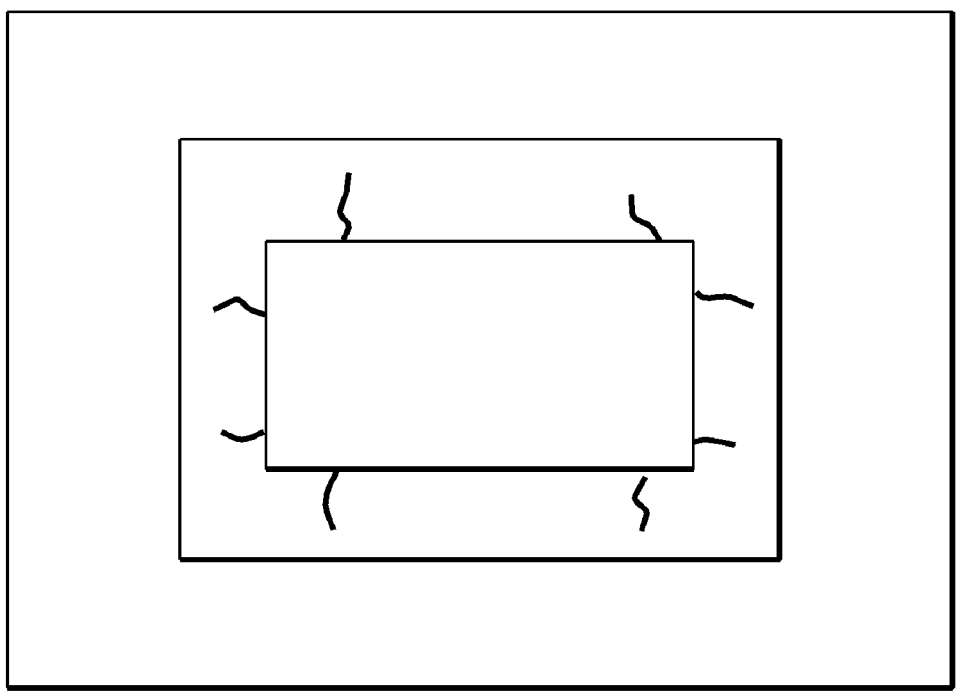

According to common practice, the various features of the drawings are not necessarily drawn to scale. Dimensions of various features may be expanded or reduced to more clearly illustrate the embodiments of the invention.

DETAILED DESCRIPTION

A first embodiment is a method of making a fired-on-foil single dielectric layer capacitor structure that comprises: providing a metallic foil; forming a capacitor dielectric over the metallic foil; forming a first electrode over the entirety of the dielectric and over a portion or all of the metallic foil and firing the capacitor structure under copper thick-film firing conditions.

According to a second embodiment, a method of making a fired-on-foil single dielectric layer capacitor structure comprises: providing a metallic foil; forming an insulating isolation layer over the metallic foil; forming a capacitor dielectric over the metallic foil into the enclosure created by the insulating isolation layer; forming a first electrode over the entirety of the dielectric and over a portion or all of the insulation isolation layer, and firing the capacitor structure under copper thick-film firing conditions.

According to a third embodiment, a modification of the second embodiment, a method of making a fired-on-foil single dielectric layer capacitor structure comprises: providing a metallic foil; forming an insulating isolation layer over the metallic foil; forming a capacitor dielectric over the metallic foil into the enclosure created by the insulating isolation layer; forming a first electrode over the entirety of the dielectric and over a portion or all of the insulation isolation layer and a portion of the metallic foil, and firing the capacitor structure under copper thick-film firing conditions.

According to a forth embodiment, a method of making a fired-on-foil two dielectric layer capacitor structure comprises: providing a metallic foil; forming an insulating isolation layer over the metallic foil; forming a capacitor dielectric over the metallic foil into the enclosure created by the insulating isolation layer; forming a first electrode over the entirety of the dielectric and over a portion or all of the insulation isolation layer and a portion of the metallic foil, and firing the first capacitor structure under copper thick-film firing conditions; forming a second capacitor dielectric layer over the first electrode; forming a second electrode that covers the entirety of the second capacitor dielectric layer and a portion of the insulating isolation layer and a portion of the foil and firing the structure under copper thick-film firing conditions.

According to a fifth embodiment, a method of making a fired-on-foil two dielectric layer capacitor structure comprises: providing the article of the first embodiment; forming an insulating isolation layer over the first electrode so that it forms an enclosed area; forming a second capacitor dielectric layer over the first electrode within the enclosed area defined by the isolation layer and over a portion of the isolation layer; forming a second electrode that covers the entirety of the second capacitor dielectric layer and a portion of the insulating isolation layer and firing the structure under copper thick-film firing conditions.

According to another embodiment, a method of making a fired-on-foil embedded capacitor inner layer comprises: laminating the component side of the fired-on-foil capacitor structure to a prepreg material and etching the metallic foil to form a first and second electrode in the case of the first embodiment or a first, second and third electrode in the case of the second embodiment.

According to a further embodiment; a method of making a device, including but not limited to a multilayer printed wiring board, with a fired-on-foil embedded capacitor comprises laminating the fired-on-foil embedded capacitor inner layer to additional prepreg material and forming at least one via through the prepreg material to connect with at least one electrode.

According to the above embodiments, the electrode covers the entirety of and encapsulates the dielectric. The encapsulating electrode places compressive stress over all dimensions of the dielectric so that tensile stresses are avoided. This allows a crack free fired-on-foil capacitor to be produced allowing crack free capacitors to be embedded inside a multilayer printed wiring board. In addition, the isolation layer may also be used as a barrier layer in the above embodiments to protect the capacitor dielectric from the etching chemicals. Capacitor reliability is thereby improved.

While the present invention is described in terms of the formation of a printed wiring board, it is understood by those skilled in the art that the embodiments of the present invention may be useful in various devices including an interposer, printed wiring board, multichip module, area array package, system-on-package, and system-in-package.

The present invention is further directed to a method of making a device, comprising: providing a metallic foil having a component side and a foil side; forming an insulating isolation layer over the metallic foil; forming a dielectric over the metallic foil wherein the dielectric is surrounded by and in contact with an insulating isolation layer; forming a first electrode over the entirety of the dielectric, over a portion of the insulating isolation layer and over a portion of the metallic foil, thus forming an encapsulating electrode; laminating the component side of the metallic foil to at least one prepreg material; etching the metallic foil to form a second electrode, wherein the first encapsulating electrode, the dielectric and the second electrode form a capacitor.

A further embodiment of the present invention is directed to a device, comprising: at least one capacitor embedded in at least one layer of dielectric material, the capacitor comprising: a metallic foil, at least one layer of dielectric material, and a first electrode wherein said first electrode is formed from a printed electrode that covers the entirety of a first layer of dielectric material and a portion of the metallic foil; a second layer of dielectric material adjacent to the first electrode; and a second electrode formed from the metallic foil and adjacent to said first layer of dielectric material and second layer of dielectric material.

In a further embodiment, the present invention is directed to a device, comprising: at least one capacitor embedded in at least one layer of dielectric material, the capacitor comprising: a metallic foil, at least one layer of dielectric material, insulation isolation layer and a first electrode wherein said first electrode is formed from a printed electrode that covers the entirety of a first layer of said dielectric material, a portion of the insulating isolation layer and a portion of the metallic foil; a second layer of dielectric material adjacent to the first electrode and the insulation isolation layer; and a second electrode formed from said metallic foil and adjacent to said first layer of dielectric material and second layer of dielectric material.

Those skilled in the art will appreciate the above stated advantages and other advantages and benefits of various additional embodiments of the invention upon reading the detailed description of the embodiments below.

Figure 2A:
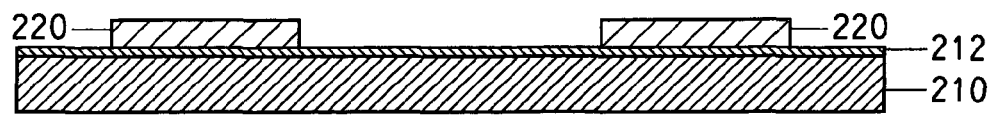
FIGS. 2A-2K are a series of views illustrating a method of manufacturing a printed wiring board with fired-on-foil embedded capacitors that have a printed electrode covering the entirety of the dielectric.
Figure 2B:
Figure 2C:
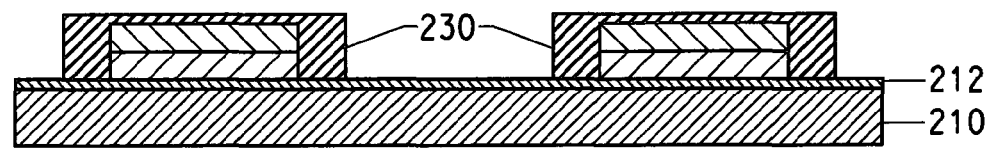
Figure 2D:
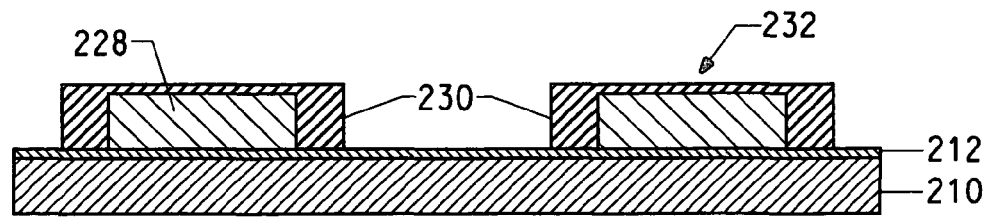
Figure 2E:
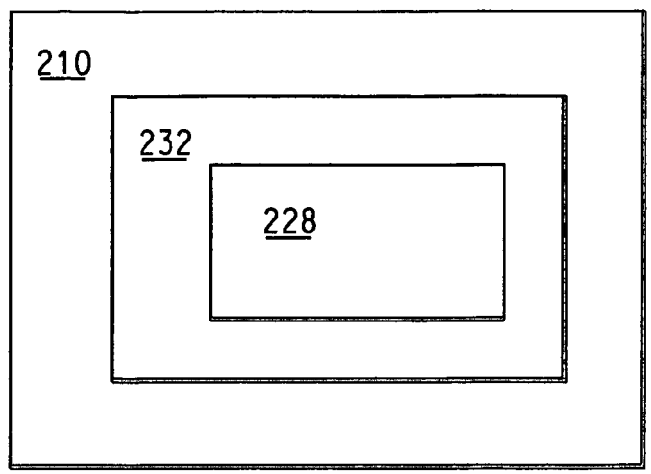
Figure 2F:
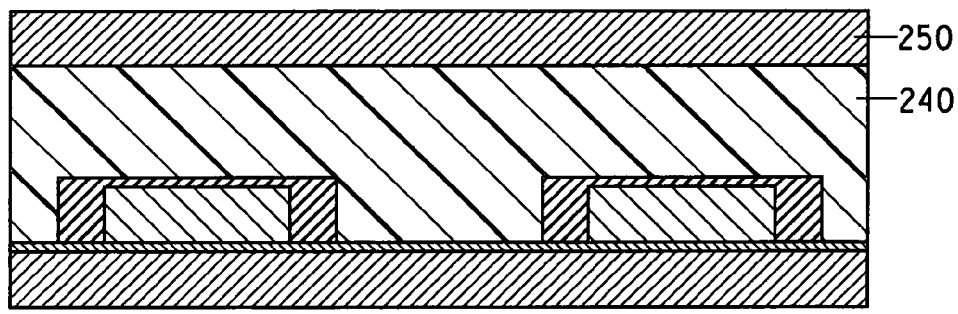
Figure 2G:
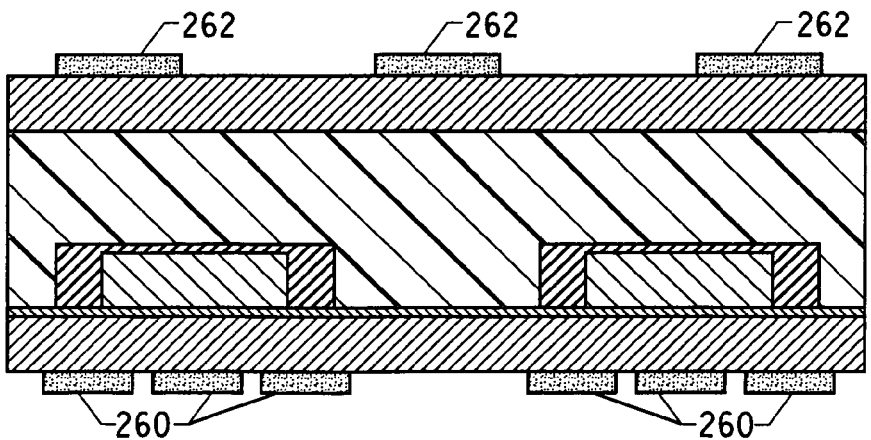
Figure 2H:
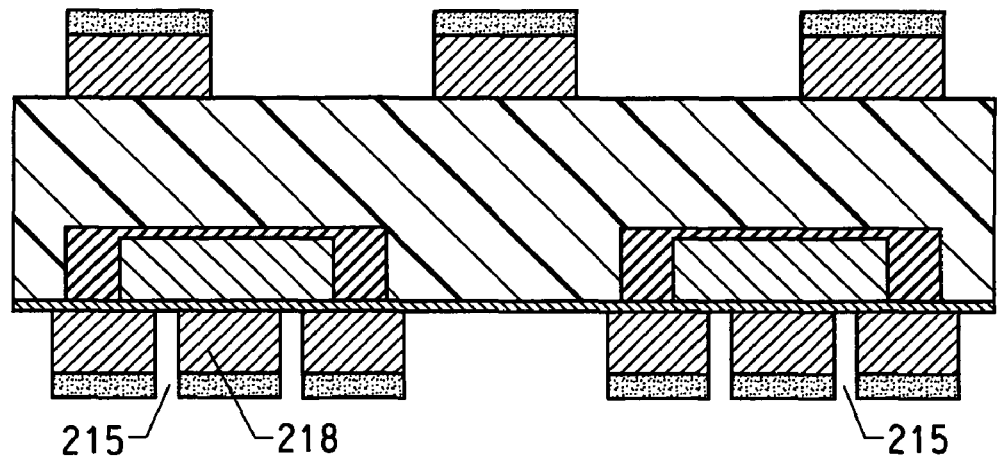
Figure 2I:
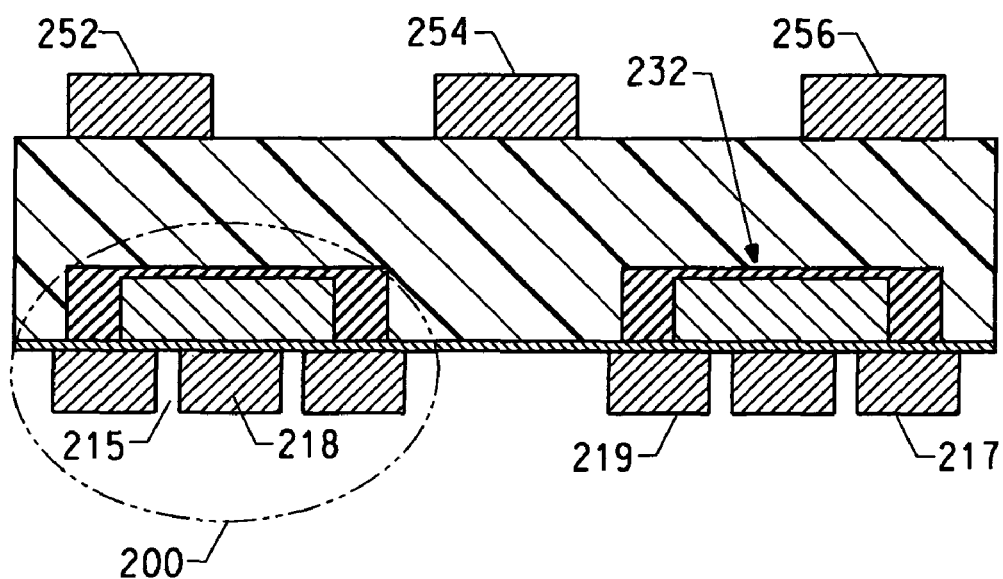
Figure 2J:
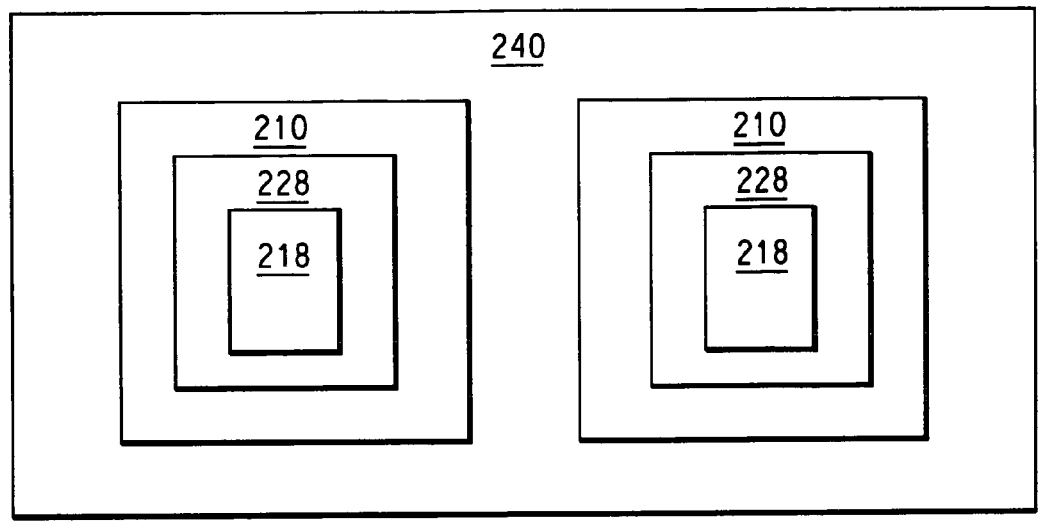

FIGS. 2A-2K illustrate a first method of manufacturing a multilayer printed wiring board 2000 (FIG. 2K) with embedded capacitors having a fired-on-foil capacitor on metallic foil design wherein a printed electrode covers the entirety of the dielectric and a portion of the metallic foil. For illustrative purposes, two embedded capacitors are illustrated as formed in FIGS. 2A-2K. However, one, two, three, or more capacitors can be formed on a foil by the methods described in this specification. The following written description is addressed to the formation of only one of the illustrated capacitors for the sake of simplicity. FIGS. 2A-2D and 2F-2I and 2K are sectional views in front elevation. FIG. 2E is a top plan view of FIG. 2D. FIG. 2J is a bottom plan view of FIG. 2I.

In FIG. 2A, a metallic foil 210 is provided. The metallic foil 210 may be of a type generally available in the industry. For example, the metallic foil 210 may be copper, copper-invar-copper, invar, nickel, nickel-coated copper, or other metals and alloys that have melting points that exceed the firing temperature for thick film pastes. Suitable foils include foils comprised predominantly of copper, such as reverse treated copper foils, double-treated copper foils, and other copper foils commonly used in the multilayer printed wiring board industry. The thickness of the metallic foil 210 may be in the range of, for example, about 1-100 microns. Other thickness ranges include 3-75 microns, and more specifically 12-36 microns. These thickness ranges correspond to between about ⅓ oz and 1 oz copper foil.

The foil 210 may, in some embodiments, be pretreated by applying and firing an underprint 212 to the foil 210. The underprint 212 is shown as a surface coating in FIG. 2A, and may be a relatively thin layer applied to the component-side surface of the foil 210. The underprint 212 adheres well to the metal foil 210 and to layers deposited over the underprint 212. The underprint 212 may be formed, for example, from a paste applied to the foil 210 that is fired at a temperature below the melting point of the foil 210. The underprint paste may be printed as an open coating over the entire surface of the foil 210, or printed over selected areas of the foil 210. It is generally more economical to print the underprint paste over selected areas of the foil 210 rather than over the entire foil 210. However, it may be preferable to coat the entire surface of the foil 210 if oxygen-doped firing is used in conjunction with a copper foil 210, because glass content in the underprint retards oxidative corrosion of the copper foil 210.

One thick-film copper paste (disclosed in U.S. application Ser. No. 10/801,326 to Borland et al. herein incorporated by reference) suitable for use as an underprint has the following composition (amounts relative by mass):

| | |
|---|---|
| Copper powder | 58.4 |
| Glass A | 1.7 |
| Cuprous oxide powder | 5.8 |
| Vehicle | 11.7 |
| TEXANOL ® solvent | 12.9 |
| Surfactant | 0.5 |
| Total | 91.0 |

In this composition,

Glass A comprises: lead germanate of the composition $Pb_5Ge_3O_{11}$

Vehicle comprises: Ethyl cellulose N200 11%
    TEXANOL® 89%

Surfactant comprises: VARIQUAT® CC-9 NS surfactant

TEXANOL® is available from Eastman Chemical Co. VARIQUAT® CC-9

NS is available from Ashland Inc.

A capacitor dielectric material 220 is deposited over the underprint 212 of the pretreated foil 210, forming the first capacitor dielectric material layer 220 as shown in FIG. 2A. The capacitor dielectric material may be, for example, a thick-film capacitor paste that is screen-printed or stenciled onto the foil 210. The first capacitor dielectric material layer 220 is then dried. In FIG. 2B, a second capacitor dielectric material layer 225 is then applied, and dried. In an alternative embodiment, a single layer of capacitor dielectric material may be deposited to an equivalent thickness of the two layers 220, 225, in a single screen-printing step. One suitable thick-film capacitor material (disclosed in U.S. application Ser. No. 10/801,257 to Borland et al., herein incorporated by reference) for use in fired-on-foil embodiments has the following composition (amounts relative by mass):

| | |
|---|---|
| Barium titanate powder | 68.55 |
| Lithium fluoride | 1.0 |
| Barium fluoride | 1.36 |
| Zinc fluoride | 0.74 |
| Glass A | 10.25 |
| Glass B | 1.0 |
| Glass C | 1.0 |
| Vehicle | 5.9 |
| TEXANOL ® solvent | 8.7 |
| Oxidizer | 1.0 |
| Phosphate wetting agent | 0.5 |
| Total | 100.00 |

In this composition,

Glass A comprises: lead germanate of the composition $Pb_5Ge_3O_{11}$

Glass B comprises: $Pb_4BaGe_{1.5}Si_{1.5}O_{11}$

Glass C comprises: $Pb_5GeSiTiO_{11}$

Vehicle comprises: Ethyl cellulose N200 11%
    TEXANOL® solvent 89%

Oxidizer comprises: Barium nitrate powder 84%
    Vehicle 16%

In FIG. 2C, a conductive material layer 230 is formed entirely over the second capacitor dielectric material layer 225 and over a portion of the metallic foil around the perimeter of the capacitor dielectric to form the first electrode, and dried. The conductive material layer 230 can be formed by, for example, screen-printing a thick-film metallic paste over the second capacitor dielectric material layer 225. The paste used to form the underprint 212 is also suitable for forming the conductive material layer 230.

The first capacitor dielectric material layer 220, the second capacitor dielectric material layer 225, and the conductive material layer 230 that forms the first electrode are then co-fired to sinter the resulting structure together. The post-fired structure section is shown in front elevation in FIG. 2D. Firing results in a single capacitor dielectric 228 formed from the capacitor dielectric layers 220 and 225, because the boundary between the capacitor dielectric layers 220 and 225 is effectively removed during co-firing. A top electrode 232 that encapsulates the capacitor dielectric layer 228 also results from the co-firing step. The surface area of the capacitor dielectric layer 228, when viewed from a top plan perspective as shown in FIG. 2E, is smaller than that of the conductive material layer 232. When fired on copper foil in nitrogen at approximately 900° C. for 10 minutes at peak temperature, the resulting capacitor dielectric 228 may have a dielectric constant of about 3000 and a dissipation factor of approximately 2.5%. Alternative firing conditions may be used to obtain differing material properties for the capacitor dielectric 228.

In FIG. 2F, the foil is laminated with prepreg material 240 with the first electrode 232 that covers the capacitor dielectric 228 facing into the prepreg material. The lamination can be performed, for example, using FR4 prepreg in standard printing wiring board processes. In one embodiment, 106 epoxy prepreg may be used. Suitable lamination conditions, for example, are 185° C. at 208 psig for 1 hour in a vacuum chamber evacuated to 28 inches of mercury. A foil 250 may be applied to an opposite side of the laminate material 240 to provide a surface for creating circuitry. A silicone rubber press pad and a smooth PTFE-filled glass release sheet may be in contact with the foils 210 and 250 to prevent the epoxy from gluing the lamination plates together. The laminate material 240 can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers.

Referring to FIG. 2G, after lamination, a photoresist is applied to the foil 210 and the foil 250. The photoresist is imaged and developed to form the photoresist patterns 260 and 262.

Referring to FIG. 2H, the foils 210 and 250 are etched, and the photoresists 260 and 262 are stripped using, for example, standard printing wiring board processing conditions to form the article shown in FIG. 2I. The etching forms a trench 215 in the foil 210 and results in a second capacitor foil electrode 218 that is isolated from the remainder of the foil and the first electrode 232. The second capacitor foil electrode 218, the dielectric 228, and the first electrode 232 form a capacitor 200. The etching process also creates copper pads 217 and 219 from the foil 210 that may act as pads for vias to connect to the capacitor electrode 232. Circuitry 252, 254, 256 is also formed from the foil 250.

FIG. 2J is a bottom plan view of the article shown in FIG. 2I. In FIG. 2J, two capacitors 200 are shown as formed from etching the trench 215 in the foil 210. This number is exemplary, however, and any number of capacitors may be formed from a foil according to the embodiments discussed herein. FIG. 2J illustrates two capacitors 200 of similar configuration, however, the present embodiment allows for the formation of capacitors of differing dimensions and/or shape.

Figure 2K:
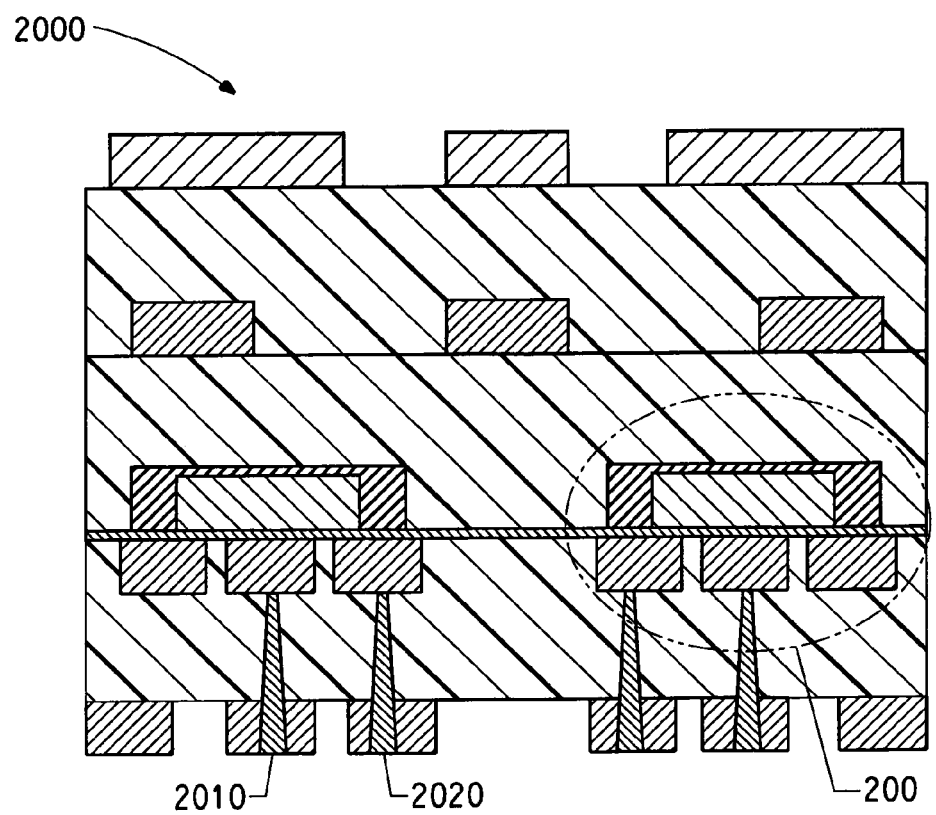

Referring to FIG. 2K, additional laminates and copper foil pairs may be laminated to the article shown in FIG. 2I and the microvias 2010 and 2020 drilled and plated. Photoresist may be added to the outer copper layers and imaged and developed. The outer layer copper foils are then etched and the remaining photoresist stripped, using standard printed wiring conditions, to complete the printed wiring board 2000.

The fabrication process described is suitable for a four metal layer printed wiring board 2000 shown in FIG. 2K with the embedded capacitors 200 in the layer adjacent to the outer layer of the printed circuit board 2000. However, the fabrication sequence may be changed and the printed wiring board may have any number of layers. The embedded capacitors according to the present embodiments can also be located at any layer in a multilayer printed circuit board. A mechanically drilled plated through hole via may also be used as a replacement for microvia 2020 to connect circuitry with the capacitor foil electrode 232.

Figure 3A:
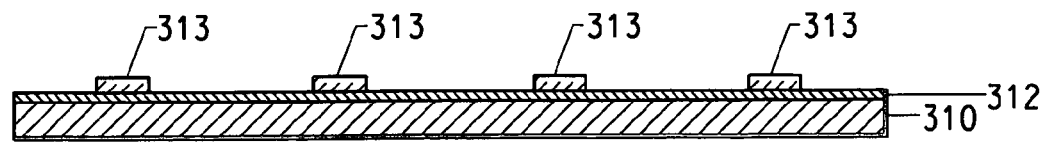
FIGS. 3A-3J are a series of views illustrating a method of manufacturing a printed wiring board with fired-on-foil embedded capacitors that have an insulating isolation layer around the periphery of the dielectric and a printed electrode covering the entirety of the dielectric.
Figure 3B:
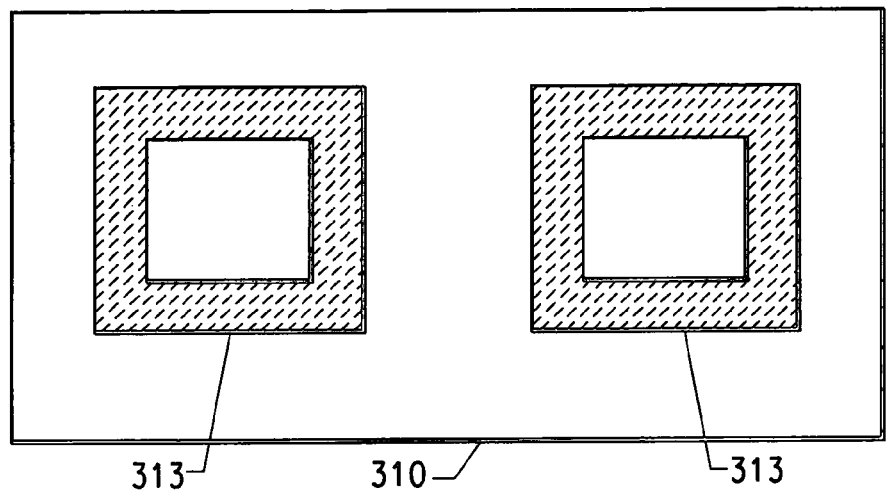

FIGS. 3A-3J illustrate a second method of manufacturing a multilayer printed wiring board 3000 (FIG. 3J) with embedded capacitors having a fired-on-foil capacitor on metallic foil design wherein a printed electrode covers the entirety of the dielectric and a portion of an insulation isolation layer. For illustrative purposes, two embedded capacitors are illustrated as formed in FIGS. 3A-3J. However, one, two, three, or more capacitors can be formed on a foil by the methods described in this specification. The following written description is addressed to the formation of only one of the illustrated capacitors for the sake of simplicity. FIGS. 3A and 3C-3J are sectional views in front elevation. FIG. 3B is a top plan view of FIG. 3A.

In FIG. 3A, a metallic foil 310 is provided. The metallic foil 310 may be of a type generally described in the first embodiment and may also be pretreated similarly as described in the first embodiment by applying and firing the underprint 312 to the foil 310.

Figure 3C:
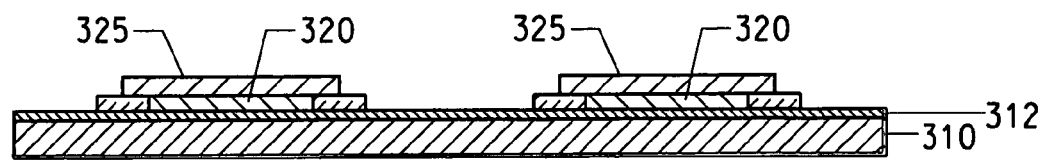

An insulating isolation layer 313 is deposited over the underprint 312 so that an enclosure is formed. A suitable insulating isolation layer may be an insulating ceramic-filled glass composition that does not crack when co-fired with copper under copper thick-film firing conditions. A top plan view of the resulting article is shown in FIG. 3B. Referring to FIG. 3C, the capacitor dielectric material as described in the first embodiment is deposited over the underprint 312 of the pretreated foil 310 into the enclosed area formed by the insulating isolation layer 313, forming a first capacitor dielectric material layer 320. The first capacitor dielectric material layer 320 is then dried. A second capacitor dielectric material layer 325 is then applied, and dried. In an alternative embodiment, a single layer of capacitor dielectric material may be deposited to an equivalent thickness of the two layers 320, 325, in a single screen-printing step.

Figure 3D:
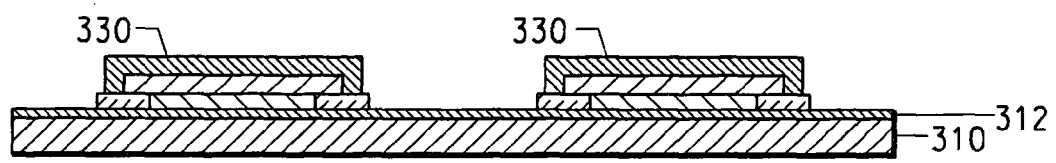
Figure 3E:
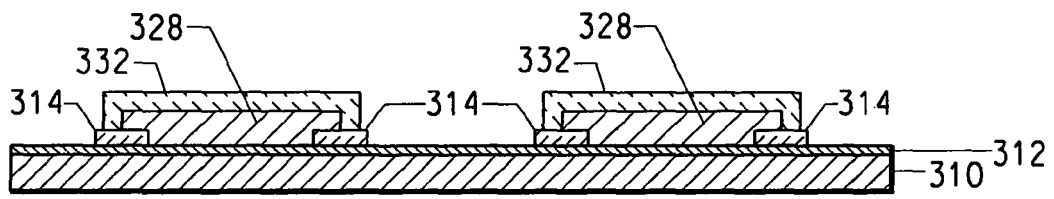

In FIG. 3D, a conductive material layer 330 is formed entirely over the second dielectric material layer 325 and over a portion of the insulating isolation layer 313, and dried. The conductive material layer 330 can be formed by, for example, by screen-printing the thick-film metallic paste described in the first embodiment over the second dielectric material layer 325.

The insulating isolation layer 313, the first capacitor dielectric material layer 320, the second capacitor dielectric material layer 325, and the conductive material layer 330 that forms the first electrode are then co-fired to sinter the resulting structure together. The post-fired structure section is shown in front elevation in FIG. 3E. Firing results in a single capacitor dielectric 328 formed from the capacitor dielectric layers 320 and 325, because the boundary between the capacitor dielectric layers 320 and 325 is effectively removed during co-firing. An insulating isolation layer 314, joined to the single capacitor dielectric 328, results from the firing. A top electrode 332 that encapsulates the capacitor dielectric layer 328 also results from the co-firing step. The surface area of the capacitor dielectric layer 328 is smaller than that of the conductive material layer 332. When fired on copper foil in nitrogen at approximately 900° C. for 10 minutes at peak temperature, the resulting capacitor dielectric 328 may have a dielectric constant of about 3000 and a dissipation factor of approximately 2.5%. Alternative firing conditions may be used to obtain differing material properties for the capacitor dielectric 328.

Figure 3F:
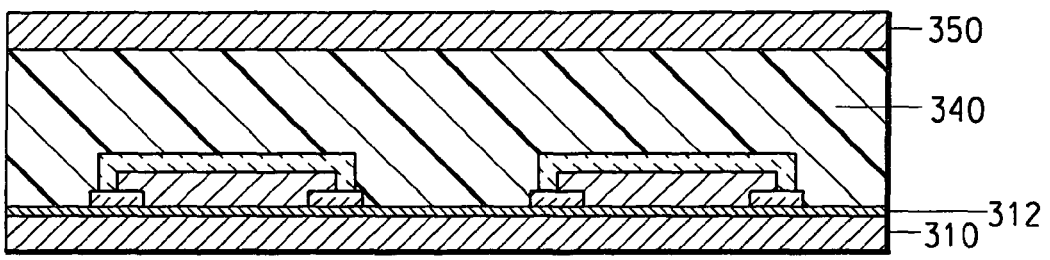

In FIG. 3F, the foil is laminated with prepreg material 340 with the first electrode 332 that covers the capacitor dielectric 328 facing into the prepreg material. The lamination can be performed with the materials and processing as described in the first embodiment. A foil 350 may be applied to an opposite side of the laminate material 340 to provide a surface for creating circuitry.

Figure 3G:
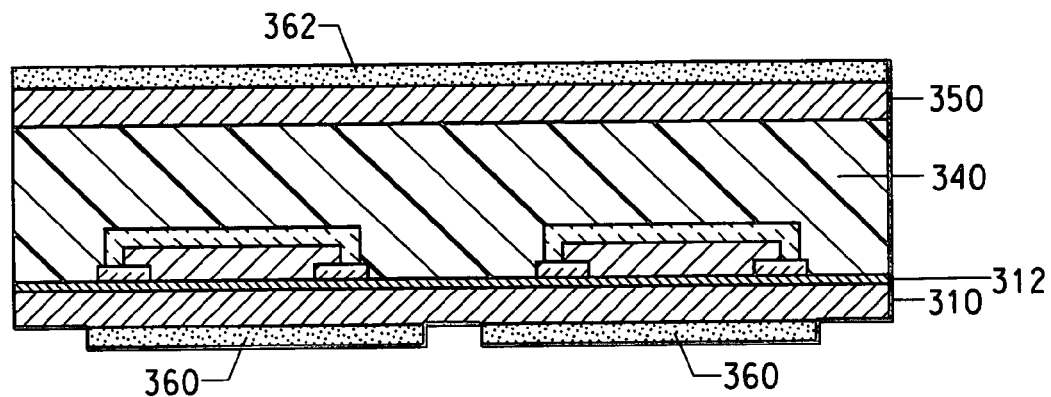

Referring to FIG. 3G, after lamination, a photoresist is applied to the foil 310 and the foil 350. The photoresist is imaged and developed to form the photoresist pattern 360. The photoresist 362 on foil 350 may not be imaged and developed at this stage as in this manufacturing sequence, copper foil 350 is generally patterned during final outer layer processing.

Figure 3H:
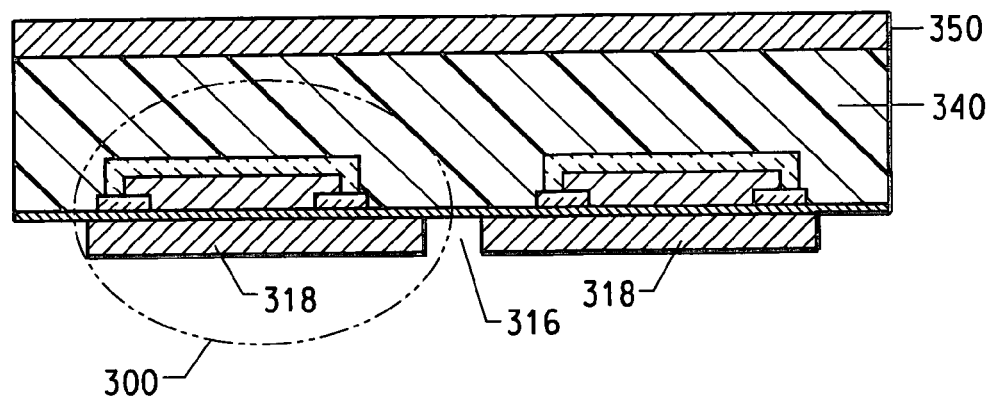

The foil 310 is etched, and the photoresists 360 and 362 are stripped using, for example, standard printing wiring board processing conditions to form the article shown in FIG. 3H. The etching forms a trench 316 in the foil 310 and results in a defined second capacitor foil electrode 318 that is isolated from the remainder of the foil without the need for the etching chemicals to come in contact with the capacitor dielectric. The second capacitor foil electrode 318, the dielectric 328, and the first electrode 332 form a capacitor 300.

Figure 3I:
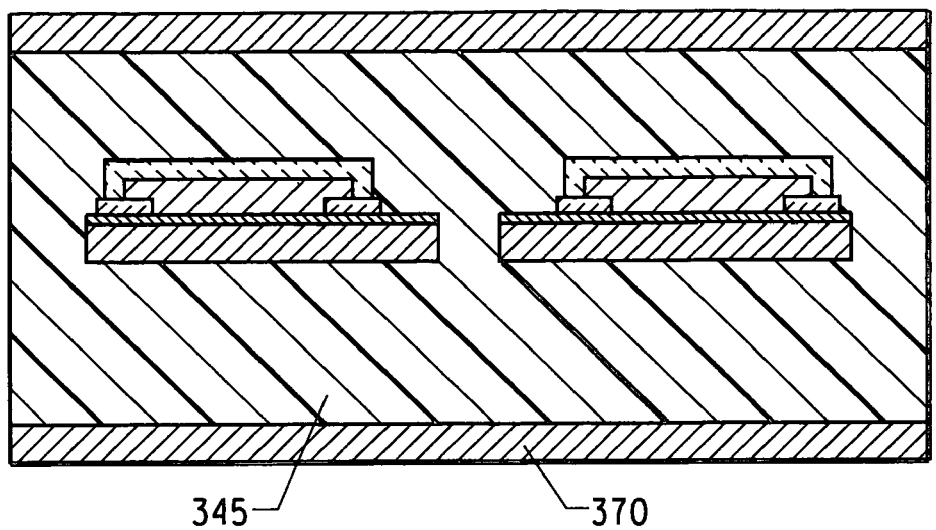
Figure 3J:
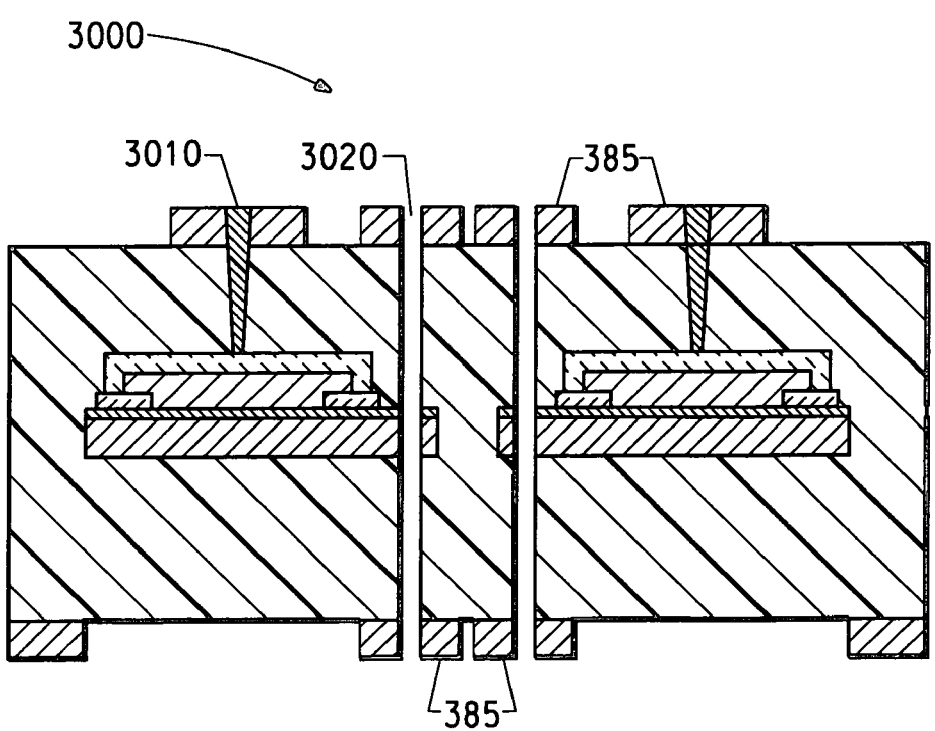

Referring to FIG. 3I, an additional laminate 345 and copper foil 370 may be laminated to the article shown in FIG. 3H. Referring to FIG. 3J, microvia 3010 and though-hole via 3020 are drilled and plated. Photoresist may be added to the outer copper layers 350 and 370 and imaged and developed. The outer layer copper foils are then etched to create circuitry 385 and the remaining photoresist stripped, using standard printed wiring conditions, to complete the circuit board 3000, as shown in FIG. 3J.

The fabrication process described is suitable for a three metal layer printed wiring board with the embedded capacitor 300 in the middle layer of the printed circuit board 3000. However, the fabrication sequence may be changed and the printed wiring board 3000 may have any number of layers. The embedded capacitors according to the present embodiments can be located at any layer in a multilayer printed circuit board.

Figure 4A:
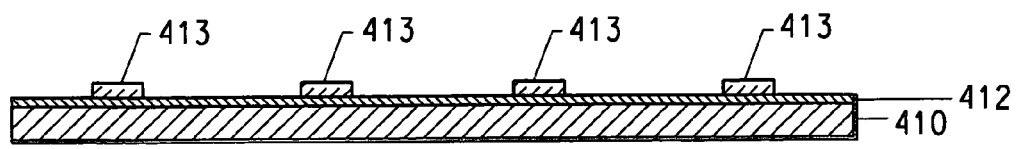
FIGS. 4A-4L are a series of views illustrating an alternative method (to that described in FIGS. 3A-3J) of manufacturing a printed wiring board with fired-on-foil embedded capacitors that have an insulating layer around the periphery of the dielectric and a printed electrode covering the entirety of the dielectric.
Figure 4B:
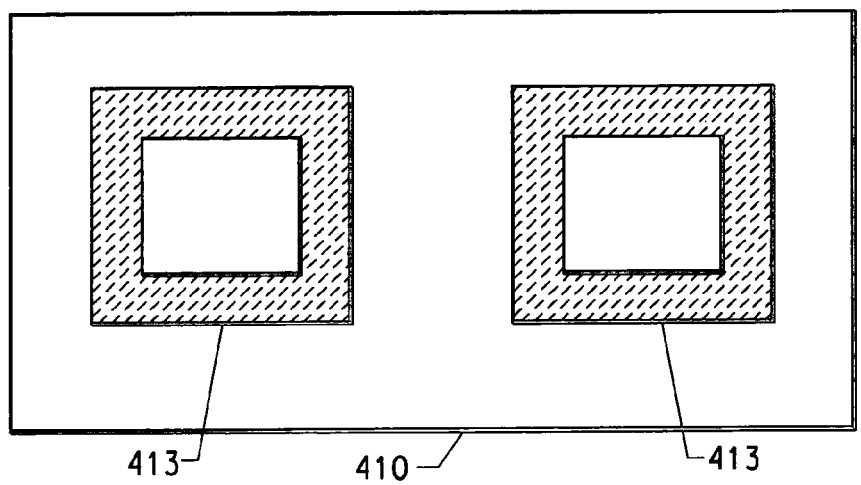
Figure 4C:
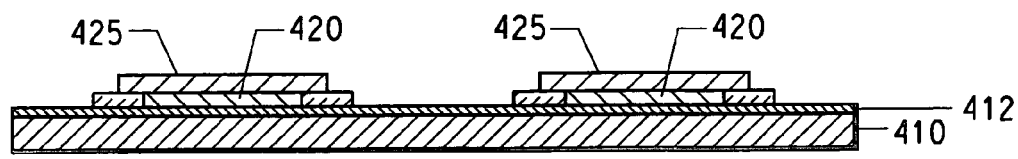
Figure 4D:
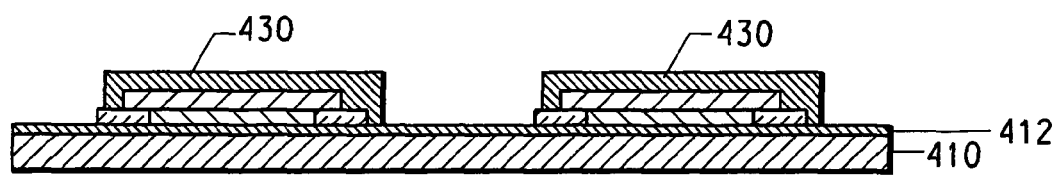
Figure 4E:
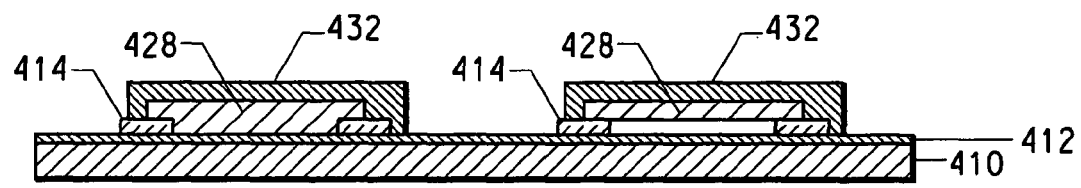
Figure 4F:
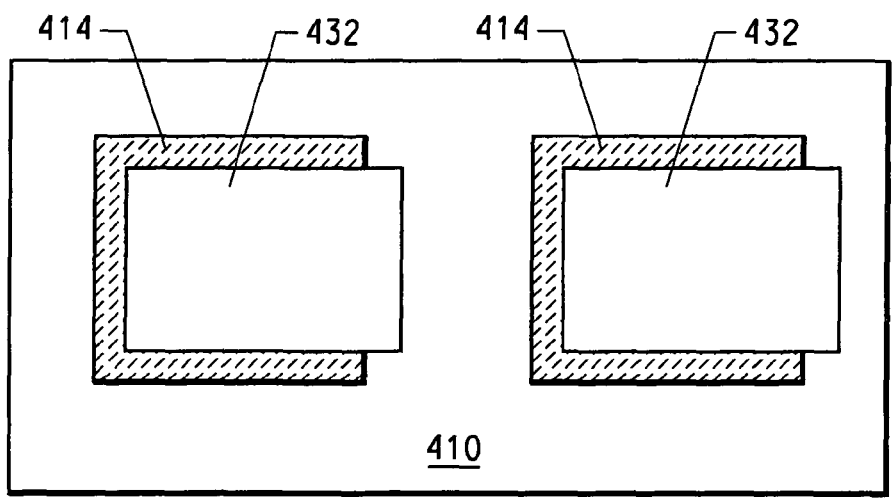
Figure 4G:
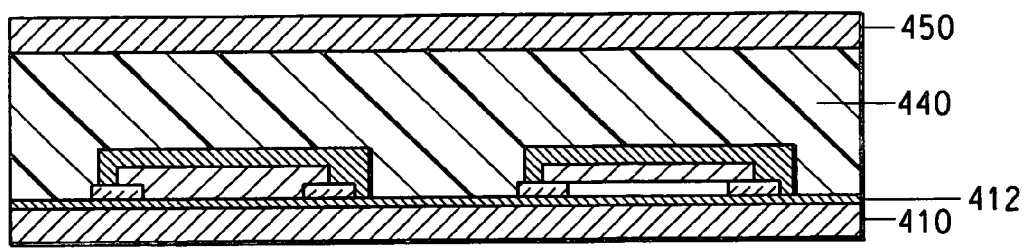
Figure 4H:
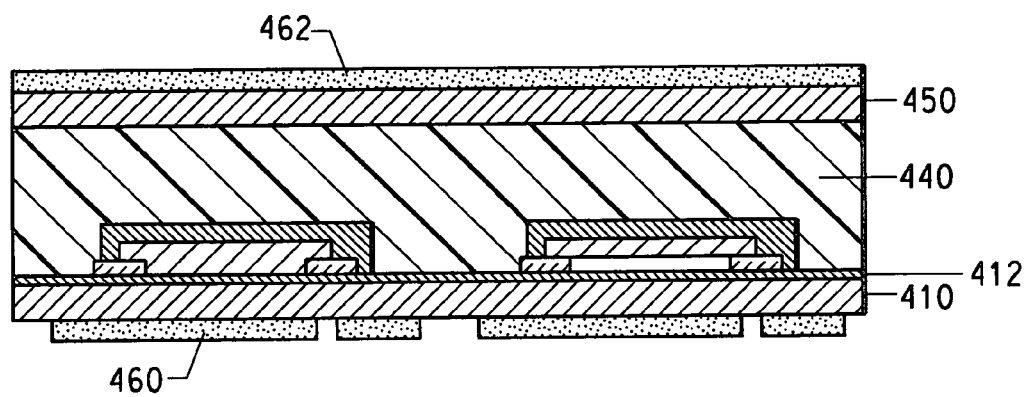
Figure 4I:
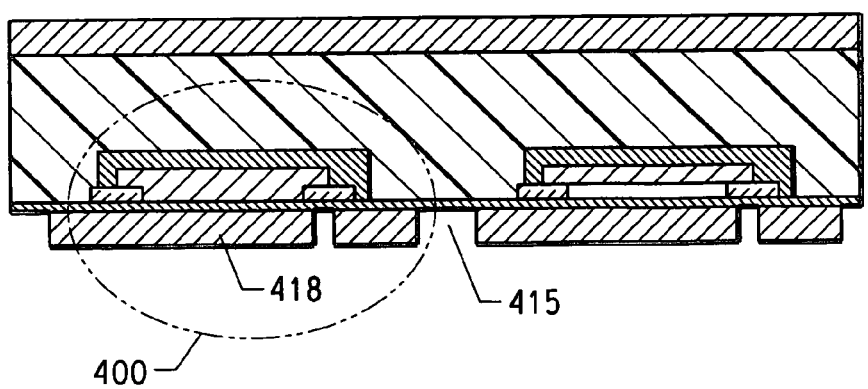
Figure 4J:
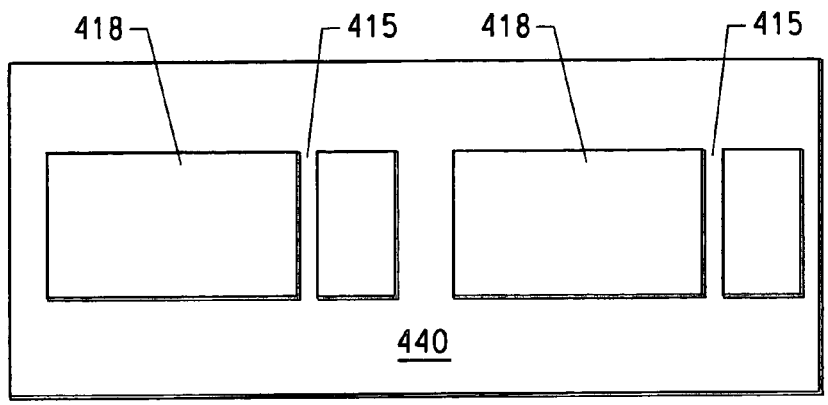

FIGS. 4A-4L illustrate an alternative method of manufacturing a multilayer printed wiring board 4000 (FIG. 4L) with embedded capacitors having a fired-on-foil capacitor on metallic foil design wherein a printed electrode covers the entirety of the dielectric, a portion of an insulation isolation layer and a portion of the metallic foil and also wherein the isolation layer also acts as a barrier layer so the capacitor dielectric is protected from etching chemicals. For illustrative purposes, two embedded capacitors are illustrated as formed in FIGS. 4A-4L. However, one, two, three, or more capacitors can be formed on a foil by the methods described in this specification. The following written description is addressed to the formation of only one of the illustrated capacitors for the sake of simplicity. FIGS. 4A and 4C-4E and 4G-4I and 4K-4L are sectional views in front elevation. FIG. 4B is a top plan view of FIG. 4A, FIG. 4F is a bottom plan view of FIG. 4E and FIG. 4J is a bottom plan view of FIG. 4I.

In FIG. 4A, a metallic foil 410 is provided. The metallic foil 410 may be of a type generally described in the first embodiment and may also be pretreated similarly as described in the first embodiment by applying and firing the underprint 412 to the foil 410.

An insulating isolation layer 413 is deposited over the underprint 412 so that an enclosure is formed. A suitable insulating isolation layer may be an insulating ceramic-filled glass composition that does not crack when co-fired with copper under copper thick-film firing conditions. A top plan view of the resulting article is shown in FIG. 4B. Referring to FIG. 4C, the capacitor dielectric material as described in the first embodiment is deposited over the underprint 412 of the pretreated foil 410 into the enclosed area formed by the insulating isolation layer 413, forming a first capacitor dielectric material layer 420. The first capacitor dielectric material layer 420 is then dried. A second capacitor dielectric material layer 425 is then applied, and dried. In an alternative embodiment, a single layer of capacitor dielectric material may be deposited to an equivalent thickness of the two layers 420, 425, in a single screen-printing step.

In FIG. 4D, a conductive material layer 430 is formed entirely over the second dielectric material layer 425, over a portion of the insulating isolation layer 413 and over a portion of the metallic foil 410, and dried. The conductive material layer 430 can be formed by, for example, by screen-printing the thick-film metallic paste described in the first embodiment over the second dielectric material layer 425.

The insulating isolation layer 413, the first capacitor dielectric material layer 420, the second capacitor dielectric material layer 425, and the conductive material layer 430 that forms the first electrode are then co-fired to sinter the resulting structure together. The post-fired structure section is shown in front elevation in FIG. 4E. Firing results in a single capacitor dielectric 428 formed from the capacitor dielectric layers 420 and 425, because the boundary between the capacitor dielectric layers 420 and 425 is effectively removed during co-firing. An insulating isolation layer 414 is formed from the isolation layer 413 and is joined to the single capacitor dielectric 428. A top electrode 432 that encapsulates the capacitor dielectric layer 428 also results from the co-firing step. A top plan view of the article of FIG. 4E is shown in FIG. 4F. The surface area of the capacitor dielectric layer 428 is smaller than that of the conductive material layer 432. When fired on copper foil in nitrogen at approximately 900° C. for 10 minutes at peak temperature, the resulting capacitor dielectric 428 may have a dielectric constant of about 3000 and a dissipation factor of approximately 2.5%. Alternative firing conditions may be used to obtain differing material properties for the capacitor dielectric 428.

In FIG. 4G, the foil is laminated with prepreg material 440 with the first electrode 432 that covers the capacitor dielectric 428 facing into the prepreg material. The lamination can be performed with the materials and processing as described in the first embodiment. A foil 450 may be applied to an opposite side of the laminate material 440 to provide a surface for creating circuitry.

Referring to FIG. 4H, after lamination, a photoresist is applied to the foil 410 and the foil 450. The photoresist is imaged and developed to form the photoresist pattern 460. The photoresist 462 on foil 450 may not be imaged and developed at this stage as in this manufacturing sequence, copper foil 450 is generally patterned during final outer layer processing.

The foil 410 is etched, and the photoresists 460 and 462 are stripped using, for example, standard printing wiring board processing conditions to form the article shown in FIG. 4I. The etching forms a trench 415 in the foil 410 and results in a capacitor foil electrode 418 that is isolated from the remainder of the foil. The second capacitor foil electrode 418, the dielectric 428, and the first electrode 432 form a capacitor 400. A bottom plan view of the resulting article is shown in FIG. 4J.

Figure 4K:
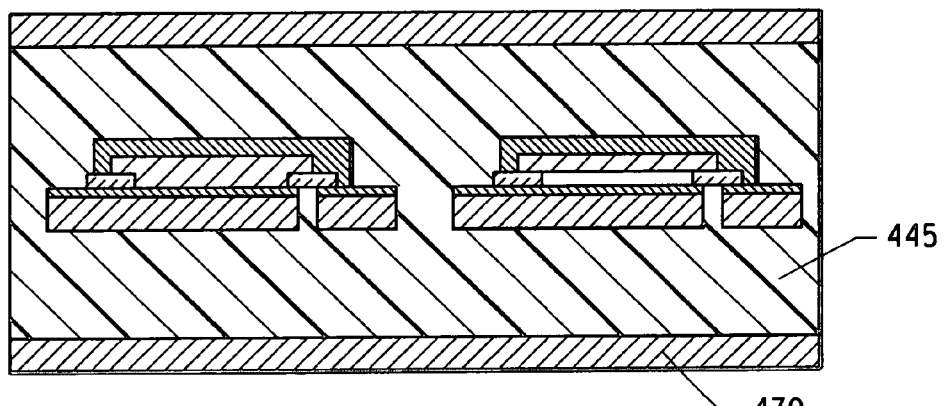
Figure 4L:
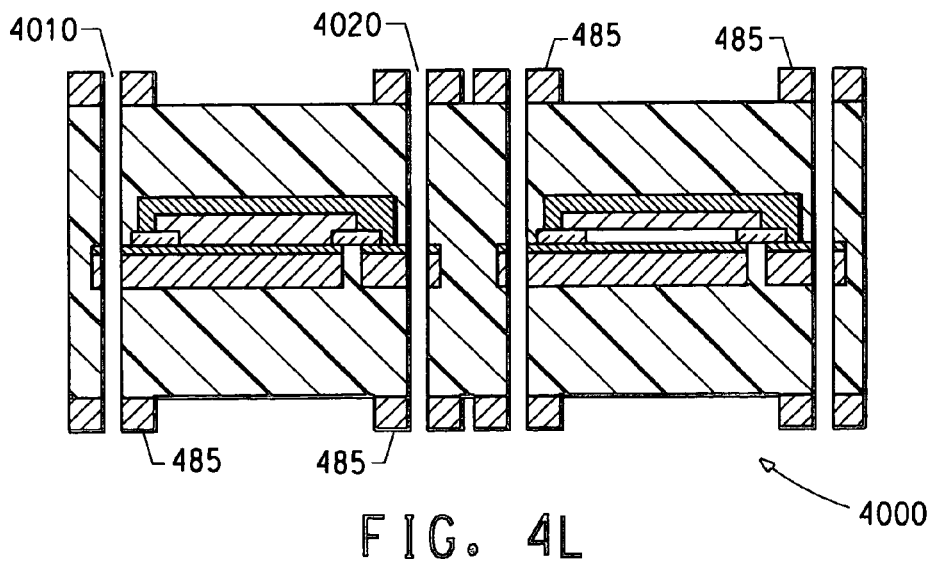

Referring to FIG. 4K, an additional laminate 445 and copper foil 470 may be laminated to the article shown in FIG. 4I. Referring to FIG. 4L, through hole vias 4010 and 4020 are drilled and plated. Photoresist may be added to the outer copper layers 450 and 470 and imaged and developed. The outer layer copper foils are then etched to create circuitry 485 and the remaining photoresist stripped, using standard printed wiring conditions, to complete the circuit board 4000.

The fabrication process described is suitable for a three metal layer printed wiring board with the embedded capacitor 400 in the middle layer of the printed circuit board 4000. However, the fabrication sequence may be changed and the printed wiring board 4000 may have any number of layers. The embedded capacitors according to the present embodiments can be located at any layer in a multilayer printed circuit board.

Figure 5A:
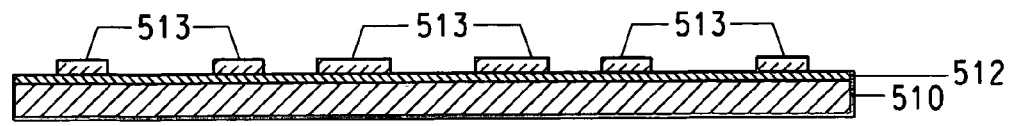
FIGS. 5A-5O are a series of views illustrating a method of manufacturing a printed wiring board with fired-on-foil embedded two dielectric layer capacitors that have printed electrodes covering the entirety of the first and second dielectric layers and wherein an isolation layer also acts as a barrier layer to protect the capacitor dielectric from etching chemicals.
Figure 5B:
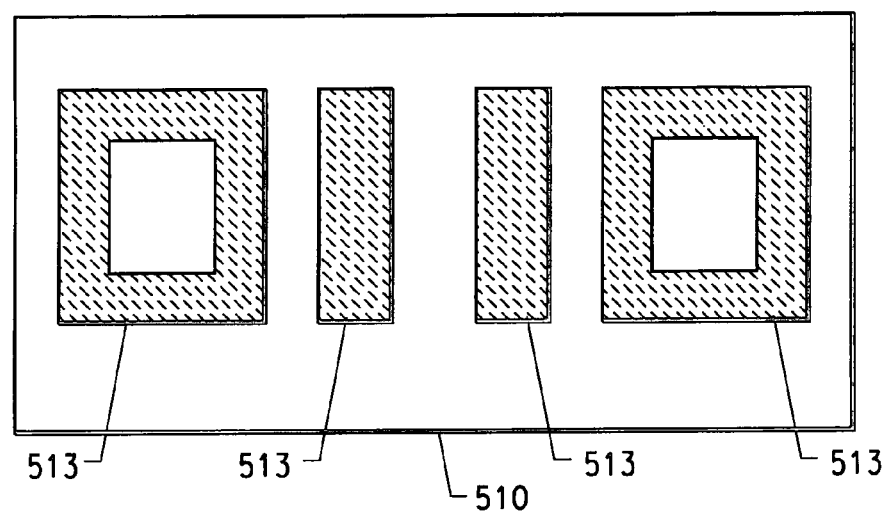
Figure 5C:
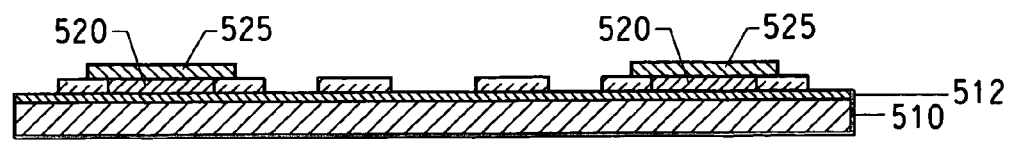
Figure 5D:
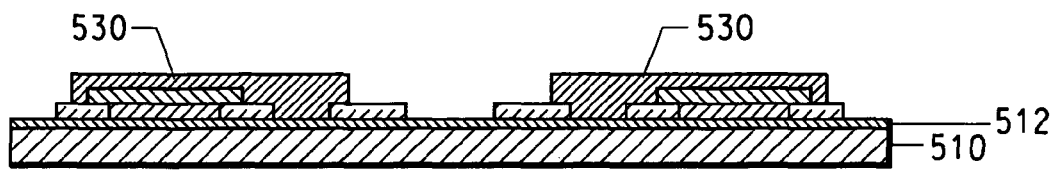
Figure 5E:
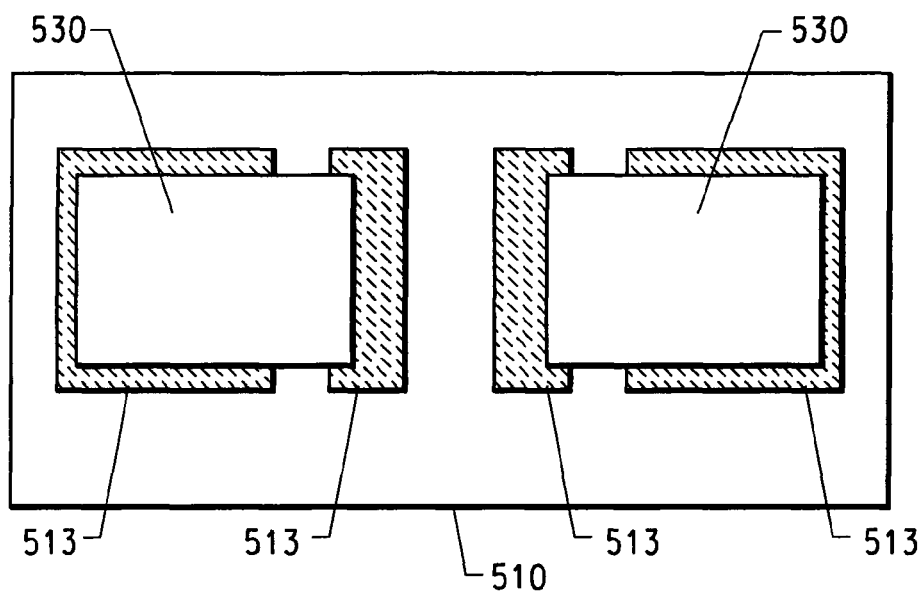
Figure 5F:
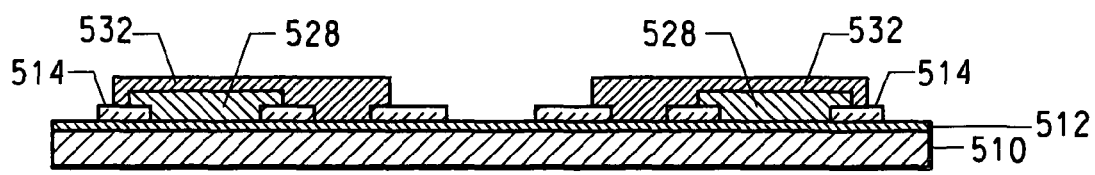

FIGS. 5A-5O illustrate a method of manufacturing a multilayer wiring board 5000 (FIG. 5O) with embedded capacitors having a fired-on-foil two dielectric layer capacitor on metallic foil design wherein a printed first electrode covers the entirety of the first dielectric layer, a portion of an isolation insulating layer and a portion of the metallic foil and the second printed electrode covers the entirety of the second dielectric layer, a portion of the insulating isolation layer and a portion of the metallic foil. For illustrative purposes, two embedded capacitors are illustrated as formed in FIGS. 5A-6O. However, one, two, three, or more capacitors can be formed on a foil by the methods described in this specification. The following written description is addressed to the formation of only one of the illustrated capacitors for the sake of simplicity. FIGS. 5A, 5C-5D, 5F-5L and FIG. 5N-5O are sectional views in front elevation. FIG. 5B is a top plan view of FIG. 5A, FIG. 5E is a top plan view of FIG. 5D, and FIG. 5M is a bottom plan view of FIG. 5L.

In FIG. 5A, a metallic foil 510 is provided. The metallic foil 510 may be of a type generally described in the first embodiment and may also be pretreated similarly as described in the first embodiment by applying and firing the underprint 512 to the foil 510.

An insulating isolation layer 513 is deposited over the underprint 512 so that an enclosure is formed. A suitable insulating isolation layer may be an insulating ceramic-filled glass composition that does not crack when co-fired with copper under copper thick-film firing conditions. A top plan view of the resulting article is shown in FIG. 5B. Referring to FIG. 5C, the capacitor dielectric material as described in the first embodiment is deposited over the underprint 512 of the pretreated foil 510 into the enclosed area formed by the insulating isolation layer 513, forming a first capacitor dielectric material layer 520. The first capacitor dielectric material layer 520 is then dried. A second capacitor dielectric material layer 525 is then applied, and dried. In an alternative embodiment, a single layer of capacitor dielectric material may be deposited to an equivalent thickness of the two layers 520, 525, in a single screen-printing step.

In FIG. 5D, a conductive material layer 530 is formed entirely over the second dielectric material layer 525, over a portion of the insulating isolation layer 513 and over a portion of the metallic foil 510 and over a further portion of the insulating isolation layer 513, and dried. The conductive material layer 530 can be formed by, for example, by screen-printing the thick-film metallic paste described in the first embodiment over the second dielectric material layer 425. A top plan view of the resulting article is shown in FIG. 5E.

The insulating isolation layer 513, the first capacitor dielectric material layer 520, the second capacitor dielectric material layer 525, and the conductive material layer 530 that forms the first electrode are then co-fired to sinter the resulting structure together. The post-fired structure section is shown in front elevation in FIG. 5F. Firing results in a single capacitor dielectric 528 formed from the capacitor dielectric layers 520 and 525, because the boundary between the capacitor dielectric layers 520 and 525 is effectively removed during co-firing. An insulating isolation layer 514 is formed from the isolation layer 513 and is joined to the single capacitor dielectric 528. A top electrode 532 that encapsulates the capacitor dielectric layer 528 also results from the co-firing step. The surface area of the capacitor dielectric layer 528 is smaller than that of the conductive material layer 532. When fired on copper foil in nitrogen at approximately 900° C. for 10 minutes at peak temperature, the resulting capacitor dielectric 528 may have a dielectric constant of about 3000 and a dissipation factor of approximately 2.5%. Alternative firing conditions may be used to obtain differing material properties for the capacitor dielectric 528.

Figure 5G:
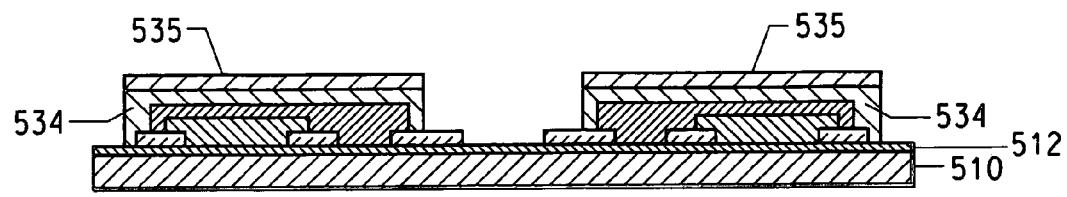
Figure 5H:
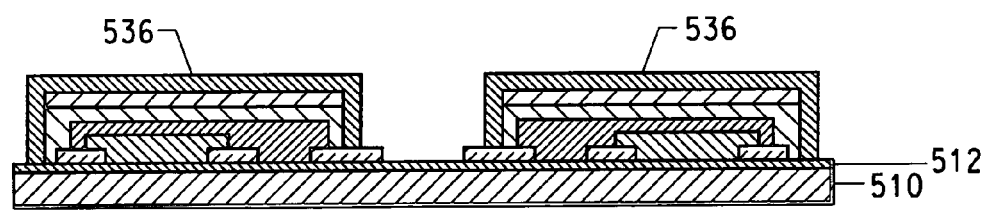
Figure 5I:
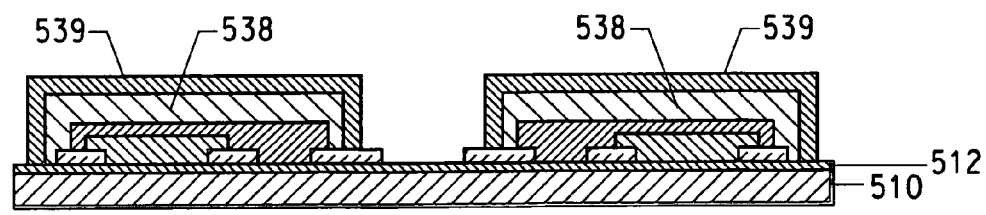

Referring to FIG. 5G, a capacitor dielectric material is deposited over the first electrode 532 to form the capacitor dielectric layer 534. A second capacitor dielectric layer 535 is deposited over the first capacitor dielectric layer 534 and dried. In an alternative embodiment, a single layer of capacitor dielectric may be deposited to an equivalent thickness of the two layers 534 and 535. A conductive layer 536 is formed entirely over the capacitor dielectric layer 535. The conductive layer 536 extends over the capacitor dielectric 535 and partially over the insulating isolation layer 514 and over the foil 510 as shown in front elevation in FIG. 5H.

The capacitor dielectric layer 534, the second capacitor dielectric layer 535, the conductive layer 536 are then co-fired under copper thick-film firing conditions to sinter the resulting structure together. The post-fired structure section is shown in front elevation in FIG. 5I. Firing results in a single capacitor dielectric 538 layer formed from the capacitor dielectric layers 534 and 535, because the boundary between the capacitor dielectric layers 534 and 535 is effectively removed during co-firing. Firing also results in a top electrode 539 that encapsulates the capacitor dielectric layer 538. When fired on copper foil in nitrogen at approximately 900° C. for 10 minutes at peak temperature, the resulting dielectric 538 may have a dielectric constant of about 3000 and a dissipation factor of approximately 2.5%. Alternative firing conditions may also be used to obtain differing material properties for the capacitor dielectric 538.

Figure 5J:
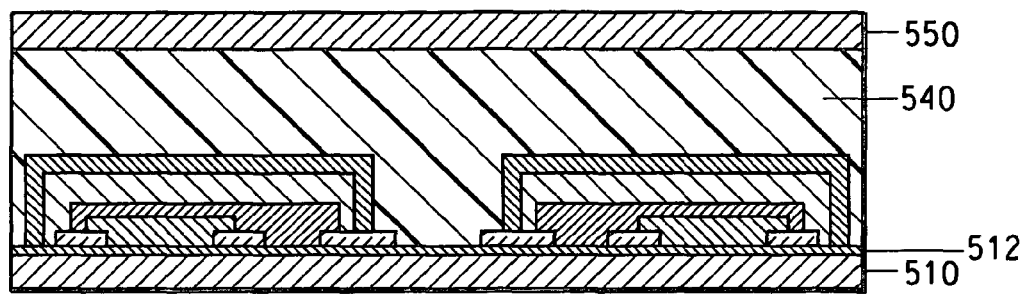
Figure 5K:
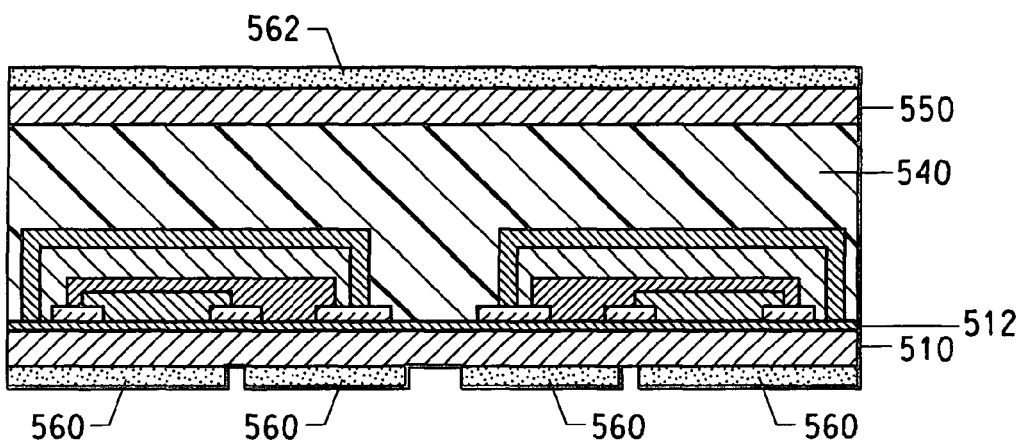

In FIG. 5J, the foil 510 is laminated with a prepreg material 540 with the second electrode 539 that covers the dielectric 538 facing into the prepreg material. The lamination can be performed, for example, using the materials and processes described in the first embodiment. A foil 550 may be applied to an opposite side of the laminate material 540 to provide a surface for creating circuitry.

After lamination, photoresist is applied to foils 510 and 550. The photoresist is imaged and developed to form the patterned photoresist 560 shown in FIG. 5K. The photoresist 562 on foil 550 may not be imaged and developed at this stage as in this manufacturing sequence, copper foil 550 is generally patterned during final outer layer processing.

Figure 5L:
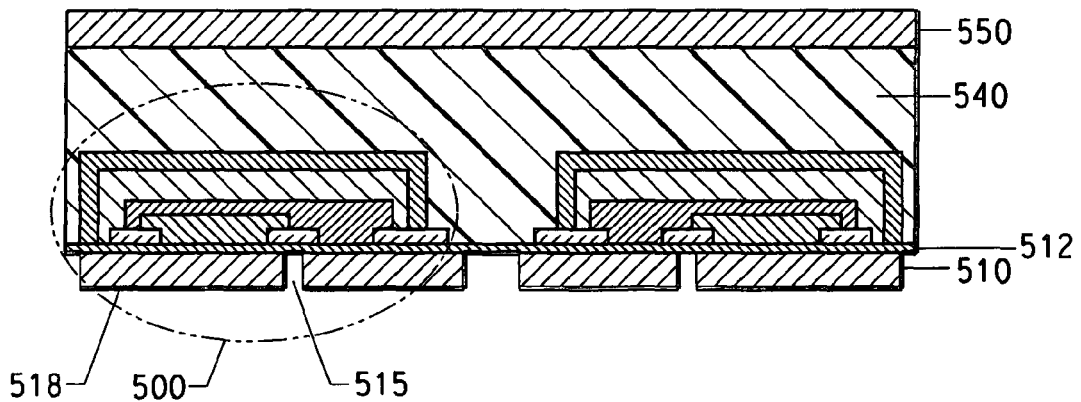
Figure 5M:
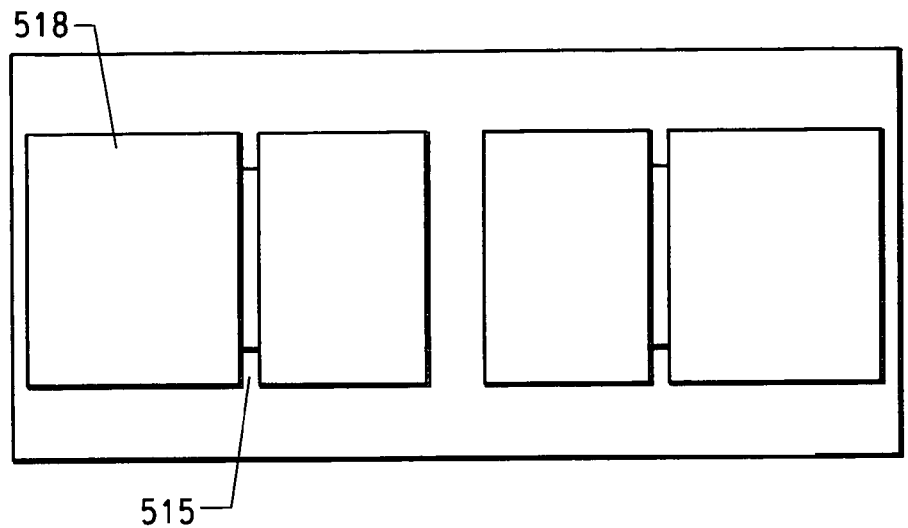

The foil 510 is etched, and the photoresists 560 and 562 are stripped using standard printing wiring board processing materials and conditions to form the article shown in FIG. 5L. The etching forms a trench 515 in the foil 510 that forms the capacitor foil electrode 518 that is isolated from the remainder of the foil and the first electrode 532. The first capacitor electrode 532, the second capacitor electrode 539, the foil capacitor electrode 518, the first dielectric 528, and the second dielectric 538, form the structure of a two dielectric layer capacitor 500. A bottom plan view of the resulting article is shown in FIG. 5M.

Figure 5N:
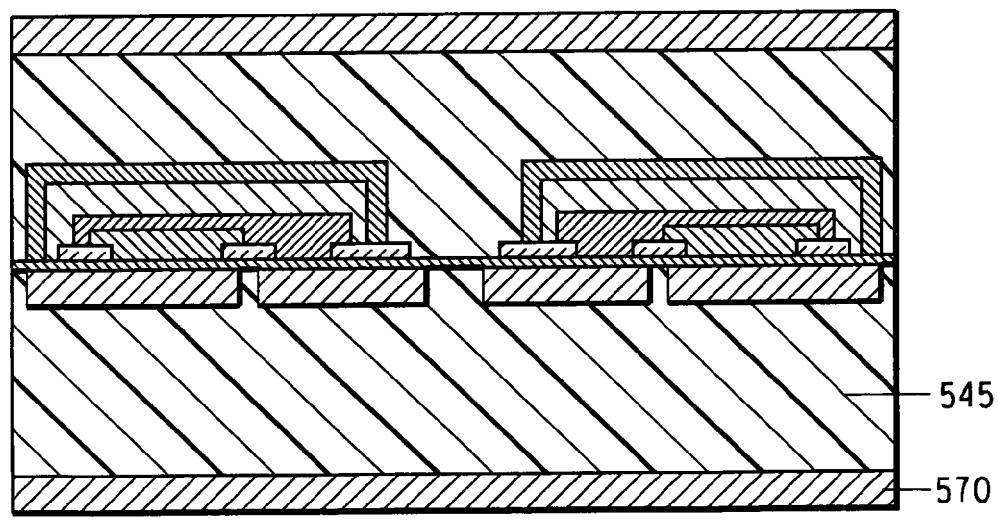
Figure 50:
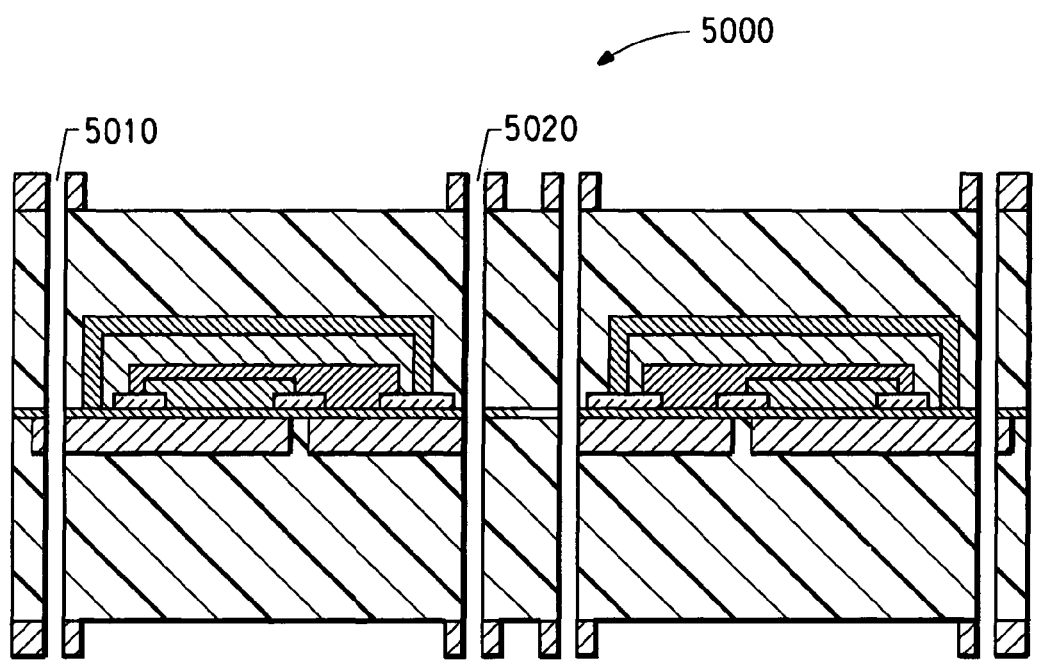

Referring to FIG. 5N, an additional laminate 545 and copper foil 570 may be laminated to the article shown in FIG. 5L. Through hole vias 5010 and 5020 may then be drilled and plated. Photoresist may then be applied to the outer layer copper foils 510 and 570. The photoresist is imaged and developed, the copper foils etched and the remaining photoresist stripped to complete the outer circuitry resulting in the article shown in FIG. 5O. The board may receive additional treatment, such as a tarnish resistant coating to complete the circuit board 5000.

The fabrication process described is suitable for a three metal layer printed wiring board with the embedded capacitors 500 in the middle layer of the printed circuit board 5000. However, the fabrication sequence may be changed and the printed wiring board 5000 may have any number of layers. The embedded capacitors according to the present embodiments can be located at any layer in a multilayer printed circuit board.

Figure 6A:
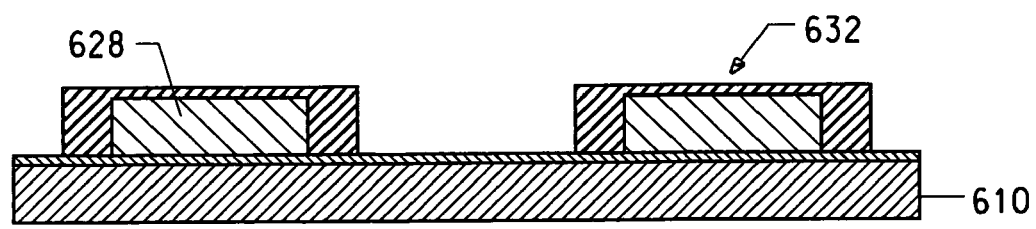
FIGS. 6A-6K are a series of views illustrating an alternative method of manufacturing a printed wiring board with fired-on-foil embedded two dielectric layer capacitors that have printed electrodes covering the entirety of the first and second dielectric layers.
Figure 6B:
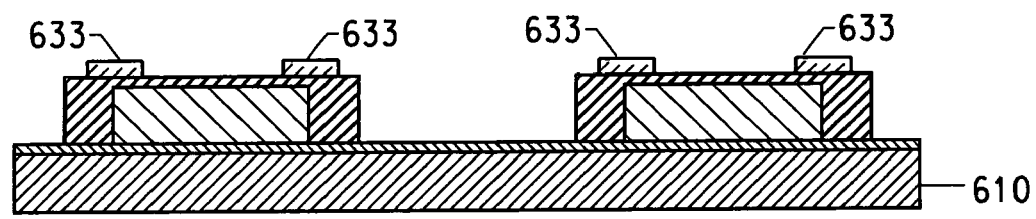
Figure 6C:
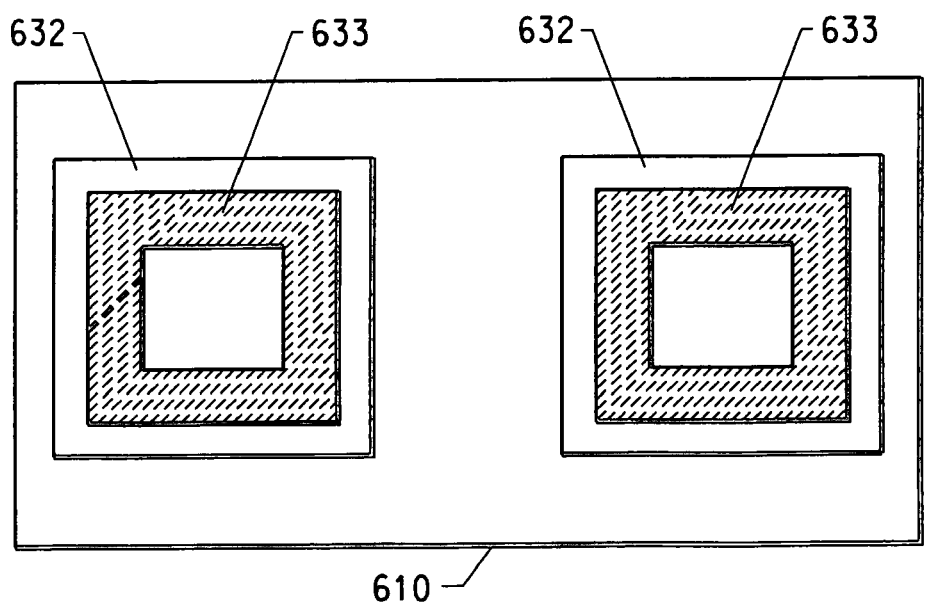
Figure 6D:
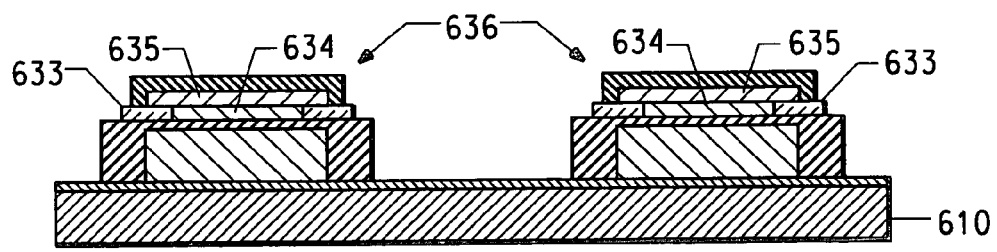
Figure 6E:
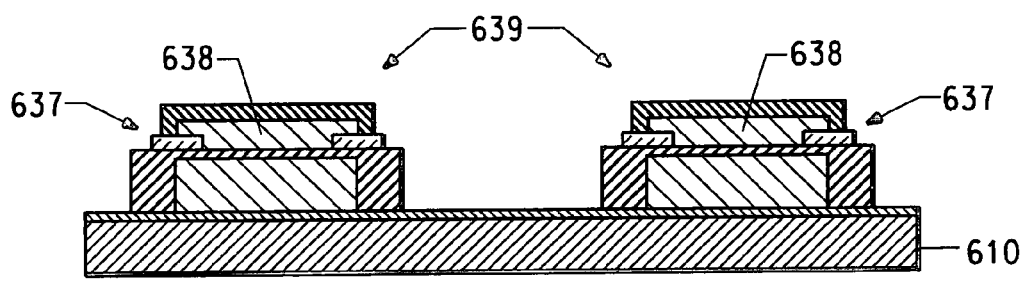
Figure 6F:
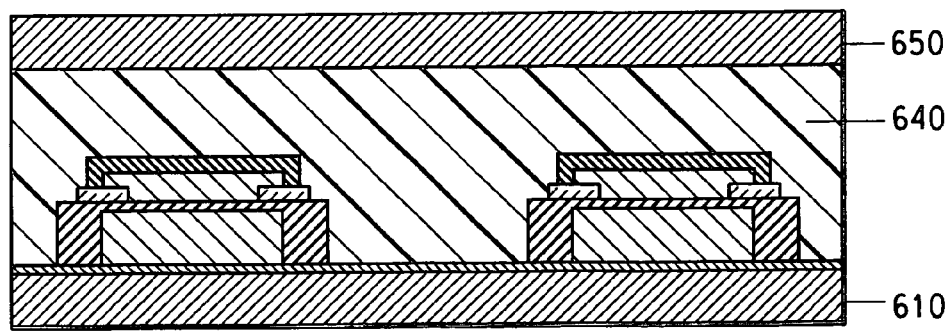
Figure 6G:
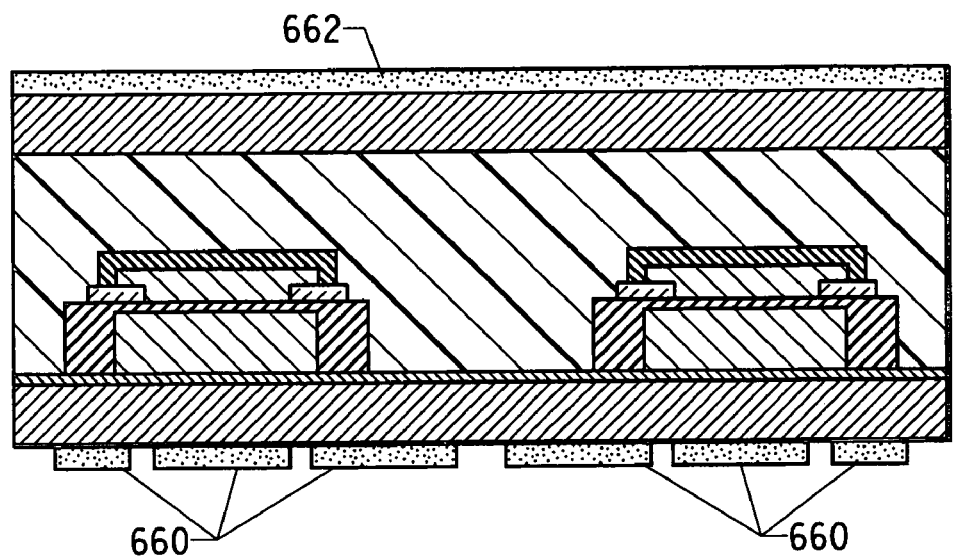
Figure 6H:
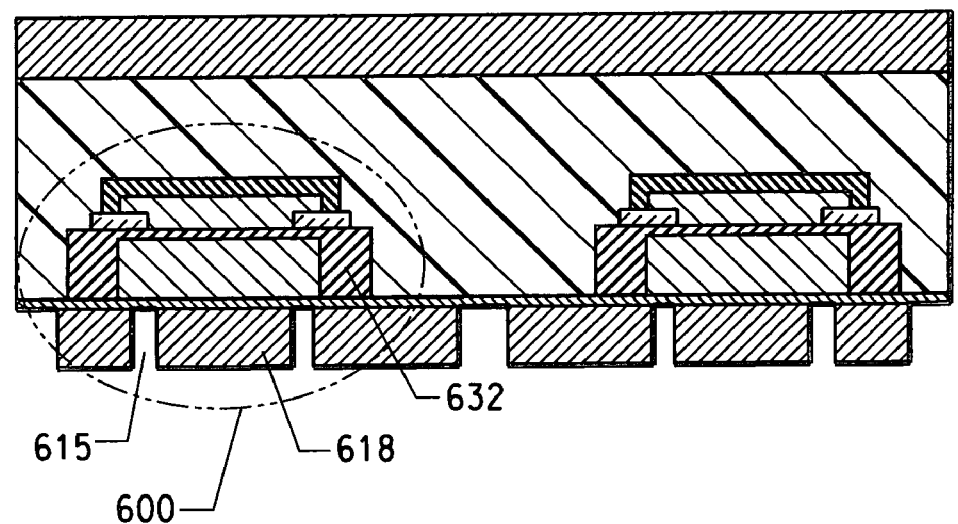
Figure 6I:
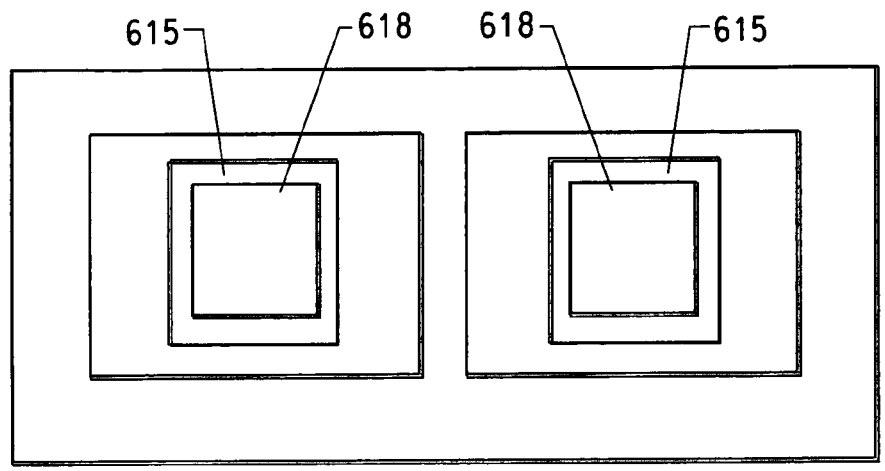

FIGS. 6A-6K illustrate another alternative method of manufacturing a multilayer wiring board 6000 (FIG. 4K) with embedded capacitors having a fired-on-foil two dielectric layer capacitor on metallic foil design wherein a printed first electrode covers the entirety of the first dielectric layer and a portion of the metallic foil and the second printed electrode covers the entirety of the second dielectric layer and a portion of an insulation barrier layer. For illustrative purposes, two embedded capacitors are illustrated as formed in FIGS. 6A-6K. However, one, two, three, or more capacitors can be formed on a foil by the methods described in this specification. The following written description is addressed to the formation of only one of the illustrated capacitors for the sake of simplicity. FIGS. 6A-6B, 6D-6H and 6J and 6K are sectional views in front elevation. FIG. 6C is a top plan view of FIG. 6B and FIG. 6I is a bottom plan view of FIG. 6H.

In FIG. 6A, the article as generally represented in FIG. 2D is provided. An insulating isolation layer 633 is deposited over the electrode 632 that covers the entirety of the capacitor dielectric 628 and dried. A top plan view of the resulting article is shown in FIG. 6C. The insulating isolation layer 633 forms an enclosure on the encapsulating electrode 632. A suitable insulating isolation layer may be an insulating filled glass composition that does not crack when co-fired with copper under copper thick-film firing conditions. In FIG. 6D, the capacitor dielectric material described in the first embodiment is deposited over the first electrode 632 and into the enclosure formed by the insulating isolation layer 633 to form the capacitor dielectric layer 634. A second capacitor dielectric layer 635 is deposited over the first capacitor dielectric layer 634 and dried. In an alternative embodiment, a single layer of capacitor dielectric may be deposited to an equivalent thickness of the two layers 634 and 635. A conductive layer 636 is formed entirely over the capacitor dielectric layer 635 using the conductive material described in the first embodiment. The conductive layer 636 extends over the capacitor dielectric 635 and partially over the insulating isolation layer 633.

The insulating isolation layer 633, the capacitor dielectric layer 634, the second capacitor dielectric layer 635, the conductive layer 636 are then co-fired under copper thick-film firing conditions to sinter the resulting structure together. The post-fired structure section is shown in front elevation in FIG. 6E. Firing results in a single capacitor dielectric 638 layer formed from the capacitor dielectric layers 634 and 635, because the boundary between the capacitor dielectric layers 634 and 635 is effectively removed during co-firing. Firing also results in an insulation isolation layer 637 that does not crack during the firing process. A top electrode 639 that encapsulates the capacitor dielectric layer 638 also results from the co-firing step. When fired on copper foil in nitrogen at approximately 900° C. for 10 minutes at peak temperature, the resulting dielectric 638 may have a dielectric constant of about 3000 and a dissipation factor of approximately 2.5%. Alternative firing conditions may also be used to obtain differing material properties for the capacitor dielectric 638.

In FIG. 6F, the foil 610 is laminated with a prepreg material 640 with the second electrode that covers the dielectric 638 facing into the prepreg material. The lamination can be performed, for example, using the materials and processes described in the first embodiment. A foil 650 may be applied to an opposite side of the laminate material 640 to provide a surface for creating circuitry.

After lamination, photoresist is applied to foils 610 and 650. The photoresist is imaged and developed to form the patterned photoresist 660 shown in FIG. 6G. The photoresist 662 on foil 650 may not be imaged and developed at this stage as in this manufacturing sequence, copper foil 650 is generally patterned during final outer layer processing.

The foil 610 is etched, and the photoresists 660 and 662 are stripped using standard printing wiring board processing materials and conditions to form the article shown in FIG. 6H. The etching forms a trench 615 in the foil 610 that creates a third capacitor foil electrode 618 that is isolated from the remainder of the foil and the first electrode 632. The first capacitor electrode 632, the second capacitor electrode 639, the third capacitor electrode 618, the first dielectric 628, and the second dielectric 638, form the structure of a two dielectric layer capacitor 600.

FIG. 6I is a bottom plan view of the article shown in FIG. 6H. In FIG. 6I, two capacitor structures 600 are shown as formed from etching a trench 615 in the foil 610. This number is exemplary, however, and any number of capacitors may be formed according to the embodiments discussed herein. FIG. 6I illustrates two capacitors 600 of similar configuration, however, the present embodiment allows for the formation of capacitors of different dimensions and/or shape.

Figure 6J:
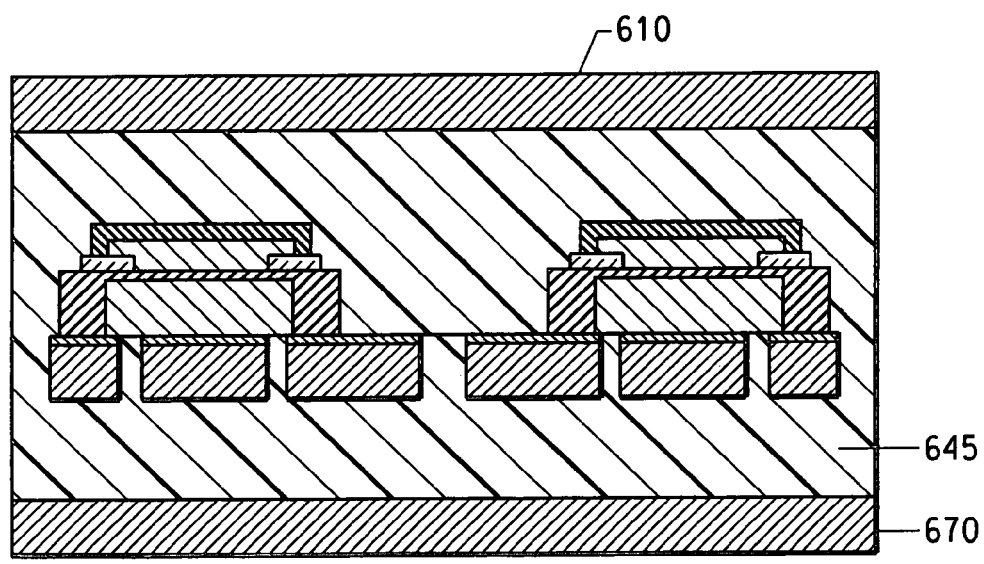
Figure 6K:
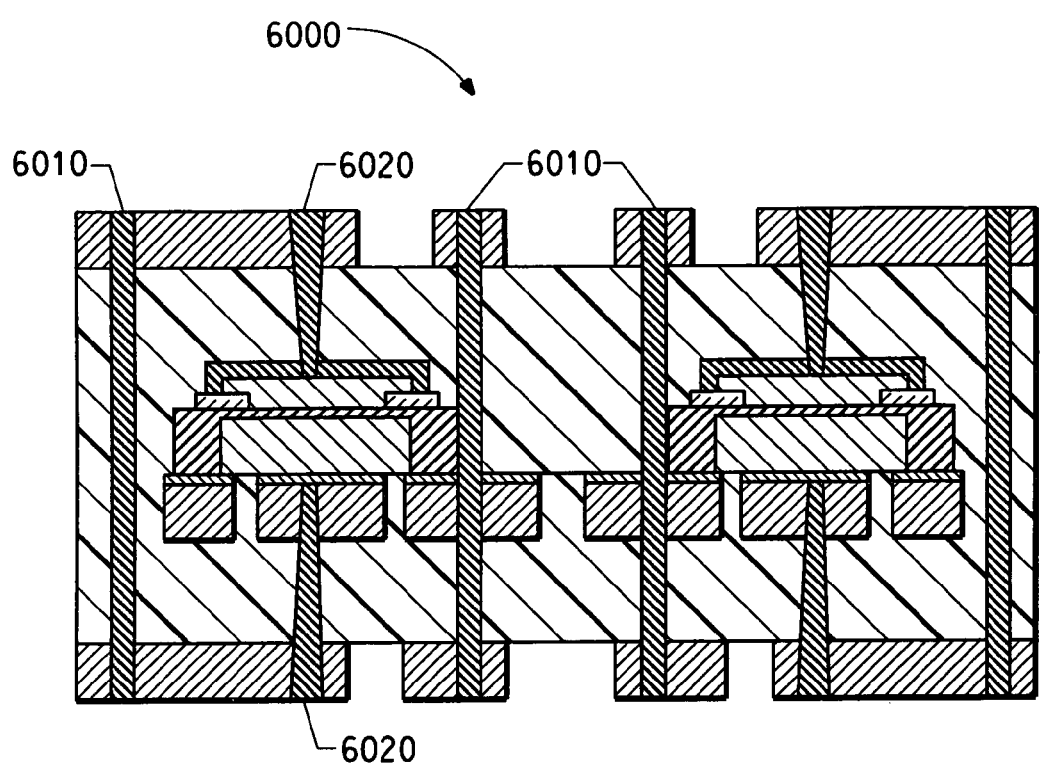

Referring to FIG. 6J, an additional laminate 645 and copper foil 670 may be laminated to the article shown in FIG. 6H. Through-hole vias 6010 and microvias 6020 may then be drilled and plated. Photoresist may then be applied to the outer layer copper foils 610 and 670. The photoresist is imaged and developed, the copper foils etched and the remaining photoresist stripped to complete the outer circuitry resulting in the article shown in FIG. 6K. The board may receive additional treatment, such as a tarnish resistant coating to complete the circuit board 6000.

The fabrication process described is suitable for a three metal layer printed wiring board with the embedded capacitors 600 in the middle layer of the printed circuit board 6000. However, the fabrication sequence may be changed and the printed wiring board 6000 may have any number of layers. The embedded capacitors according to the present embodiments can be located at any layer in a multilayer printed circuit board.

In the above embodiments, the thick-film pastes may comprise finely divided particles of ceramic, glass, metal or other solids. The particles may have a size on the order of 1 micron or less, and may be dispersed in an "organic vehicle" comprising polymers dissolved in a mixture of dispersing agent and organic solvent.

The thick-film dielectric materials may have a high dielectric constant (K) after firing. For example, a high K thick-film dielectric may be formed by mixing a high dielectric constant powder (the "functional phase"), with dopants and a glass powder and dispersing the mixture into a thick-film screen-printing vehicle. During firing, the glass component of the capacitor material softens and flows before the peak firing temperature is reached, coalesces, and encapsulates the functional phase forming the fired capacitor composite.

High K functional phases include perovskites of the general formula $ABO_3$, such as crystalline barium titanate (BT), lead zirconate titanate (PZT), lead lanthanum zirconate titanate (PLZT), lead magnesium niobate (PMN) and barium strontium titanate (BST). Barium titanate is advantageous for used in fired on copper foil applications since it is relatively immune to reducing conditions used in firing processes.

Typically, the thick-film glass component of a dielectric material is inert with respect to the high K functional phase and essentially acts to cohesively bond the composite together and to bond the capacitor composite to the substrate. Preferably only small amounts of glass are used so that the dielectric constant of the high K functional phase is not excessively diluted. The glass may be, for example, calcium-aluminum-borosilicates, lead-barium-borosilicates, magnesium-aluminum-silicates, rare earth borates or other similar compositions. Use of a glass with a relatively high dielectric constant is preferred because the dilution effect is less significant and a high dielectric constant of the composite can be maintained. Lead germanate glass of the composition $Pb_5Ge_3O_{11}$ is a ferroelectric glass that has a dielectric constant of approximately 150 and is therefore suitable. Modified versions of lead germanate are also suitable. For example, lead may be partially substituted by barium and the germanium may be partially substituted by silicon, zirconium and/or titanium.

Pastes used to form the electrode layers may be based on metallic powders of copper, nickel, silver, silver-palladium compositions, or mixtures of these compounds. Copper powder compositions are preferred.

The desired sintering temperature is determined by the metallic substrate melting temperature, the electrode melting temperature and the chemical and physical characteristics of the dielectric composition. For example, one set of sintering conditions suitable for use in the above embodiments is a nitrogen firing process having a 10 minute residence time at a peak temperature of approximately 900° C.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

Example

PWB (printed wiring board) substrates were fabricated with embedded capacitors with the screen printed electrode fully encapsulating the dielectric. A 4-layer design was used for PWB construction with the ceramic capacitors residing on layer 2 (L2). First, an innerlayer comprising L2/L3 was made and then laminated with layers 1 and 4 to complete the PWB stack. 1 oz. NT-TOI copper foils were used in L2. The TOI foil was a single side Zn-free treated electrodeposited foil and was designed to provide high bond strength on a wide range of organic substrates. Consequently, the innerlayer with the capacitors did not need to be subjected to an oxide process to ensure adequate adhesion to the 1080 FR4 prepreg used to build the boards. A low lamination pressure of 125 psi was used at both innerlayer and final lamination to avoid causing any mechanical damage to the ceramic capacitor. The capacitor height was roughly 35 μm and included 10 μm of the screen printed electrode fully encapsulating the dielectric and 20 μm of the ceramic dielectric. The two plies of FR4 in each layer were at ~150 μm in the finished boards.

The external finish on the boards was ENIG (electroless Ni/Au). All etching of copper was done with an alkaline etchant. Microvias were used to connect the embedded capacitors to copper pads on the surfaces of the substrates.

A total of 39 finished PWB panels were fabricated. Each panel had six coupons with capacitors with the design discussed in this patent. Each coupon had 18 capacitors.

What is claimed is:

1. A method of forming an embedded capacitor, comprising:
   providing a metallic foil;
   forming a dielectric layer over the metallic foil, said dielectric layer having a first surface opposite the metallic foil and a perimeter, said dielectric layer having an edge at the perimeter of said dielectric layer, said edge of the dielectric layer being at an angle to said first surface of the dielectric layer and at an angle to the metallic foil, said edge of the dielectric layer contacting the first surface of the dielectric layer and extending from the first surface of the dielectric layer towards the metallic foil;
   forming a first electrode over the entirety of said dielectric layer and at least a portion of said metallic foil, said first electrode completely covering and encapsulating both said first surface of the dielectric layer and said edge of the dielectric layer; and
   firing said metallic foil, dielectric layer and first electrode;
   etching the metallic foil to form a second electrode, said second electrode being electrically isolated from said first electrode.

2. The method of claim 1 further comprising forming an insulating isolation layer over said metallic foil prior to forming said dielectric layer over said metallic foil.

3. The method of claim 1 further comprising forming an insulating isolation layer over said dielectric layer.

4. The method of any one of claims 2 or 3 further comprising:
   forming a second capacitor dielectric layer over said first electrode;
   forming a next electrode over the entirety of said second capacitor dielectric layer and at least a portion of said insulating isolation layer and at least a portion of said metallic foil, thus forming a two dielectric layer structure; and firing said structure.

5. The method of claim 4 further comprising:
   forming a second insulation isolation layer over said first electrode.

6. A capacitor formed by the method of any one of claim 1 through 5.

7. A device comprising the capacitor of claim 6.

8. A method of making a device, comprising:
   providing a metallic foil;
   forming a dielectric over the metallic foil, thus, forming a component side and a foil side of said metallic foil, said dielectric having a first surface opposite the metallic foil and a perimeter, said dielectric having an edge at the perimeter of said dielectric, said edge of the dielectric being at an angle to said first surface of the dielectric and at an angle to the metallic foil, said edge of the dielectric contacting the first surface of the dielectric and extending from the first surface of the dielectric towards the metallic foil;

forming a first electrode over the entirety of the dielectric and over a portion of the metallic foil, said first electrode completely covering and encapsulating both said first surface of the dielectric and said edge of the dielectric;

firing said metallic foil, dielectric and first electrode;

laminating the component side of the metallic foil to at least one prepreg material; and etching the metallic foil to form a second electrode, said second electrode being electrically isolated from said first electrode, wherein the first electrode, the dielectric and the second electrode form a capacitor.

9. The method of claim 8, comprising:

forming one or more vias in the one or more prepreg material connecting to the capacitor.

10. A method of making a device, comprising:

providing a metallic foil having a component side and a foil side;

forming an insulating isolation layer over the metallic foil;

forming a dielectric over the metallic foil wherein the dielectric includes a first portion surrounded by and in contact with an insulating isolation layer and a second portion covering said first portion and extending over the insulation isolation layer, said second portion of the dielectric having a first surface opposite the metallic foil and a perimeter, said second portion of said dielectric having an edge at the perimeter of said second portion of the dielectric, said edge of said second portion of the dielectric being at an angle to said first surface of said second portion of the dielectric and at an angle to the metallic foil, said edge of said second portion of the dielectric contacting said first surface of said second portion of the dielectric and extending from said first surface of said second portion of the dielectric towards the metallic foil;

forming a first electrode over the entirety of the dielectric, over a portion of the insulating isolation layer and over a portion of the metallic foil, thus forming an encapsulating electrode, said first electrode completely covering and encapsulating both said first surface of said second portion of the dielectric and said edge of said second portion of the dielectric;

firing said metallic foil, dielectric and first electrode;

laminating the component side of the metallic foil to at least one prepreg material; and etching the metallic foil to form a second electrode, said second electrode being electrically isolated from said first electrode, wherein the first encapsulating electrode, the dielectric and the second electrode form a capacitor.

11. The method of claim 10, wherein the insulation layer also acts as a barrier layer to prevent etching chemicals from coming in contact with the capacitor dielectric.

12. The method of claim 10, wherein the device is laminated to at least one additional prepreg material after etching the metallic foil.

13. The method of claim 12, comprising:

forming one or more vias in the prepreg material connecting to the capacitor.

14. A device formed by the method of any one of claims 8, 12, or 13.

15. The device of claim 7, wherein said device is selected from an interposer, printed wiring board, multichip module, area array package, system-on-package, and system-in-package.

* * * * *

UNITED STATES PATENT AND TRADEMARK OFFICE
CERTIFICATE OF CORRECTION

| | | |
|---|---|---|
| PATENT NO. | : 7,741,189 B2 | Page 1 of 1 |
| APPLICATION NO. | : 11/453496 | |
| DATED | : June 22, 2010 | |
| INVENTOR(S) | : William J. Borland et al. | |

It is certified that error appears in the above-identified patent and that said Letters Patent is hereby corrected as shown below:

Column 18, line 29: "12, or 13." should read --10, or 13.--

Signed and Sealed this
Fifth Day of April, 2011

David J. Kappos
*Director of the United States Patent and Trademark Office*